United States Patent [19]

Miyajima et al.

[11] Patent Number: 5,537,487
[45] Date of Patent: Jul. 16, 1996

[54] PATTERN JUDGING METHOD, MASK PRODUCING METHOD, AND METHOD OF DIVIDING BLOCK PATTERN FOR USE IN BLOCK EXPOSURE

[75] Inventors: Masaaki Miyajima, Kasugai; Hiroshi Yasuda, Kawasaki; Satoru Yamazaki, Kawasaki; Kiichi Sakamoto, Kawasaki, all of Japan

[73] Assignee: Fujitsu Limited, Kanagawa, Japan

[21] Appl. No.: 257,204

[22] Filed: Jun. 9, 1994

Related U.S. Application Data

[63] Continuation-in-part of Ser. No. 917,260, Jul. 23, 1992, Pat. No. 5,347,592.

[30] Foreign Application Priority Data

Jul. 29, 1991 [JP] Japan .................... 3-188787

[51] Int. Cl.⁶ .................................................. G06K 9/00
[52] U.S. Cl. ....................... 382/144; 382/173; 348/87
[58] Field of Search ................................ 382/141, 144, 382/145, 149, 173; 364/491, 512; 348/86, 87

[56] References Cited

U.S. PATENT DOCUMENTS

| | | | |
|---|---|---|---|
| 4,510,616 | 4/1985 | Lougheed et al. | 382/144 |
| 4,811,409 | 3/1989 | Cavan | 382/144 |
| 5,046,012 | 9/1991 | Morishita et al. | 382/145 |
| 5,287,290 | 2/1994 | Tabara et al. | 382/144 |

FOREIGN PATENT DOCUMENTS

| | | | |
|---|---|---|---|
| 52-119185 | 6/1977 | Japan | H01L 21/26 |
| 62-260322 | 11/1987 | Japan | H01L 21/30 |

*Primary Examiner*—Leo Boudreau
*Assistant Examiner*—David R. Anderson
*Attorney, Agent, or Firm*—Nikaido, Marmelstein, Murray & Oram

[57] ABSTRACT

A method of dividing a block pattern for use in a block exposure, to be implemented on a computer, divides an arbitrary block which is to be formed in a block mask that is used for the block exposure when the arbitrary block is judged as including a prohibiting pattern which is undesirable from a point of view of the block exposure. This method comprises the steps of (a) dividing the arbitrary block in a first direction to obtain a first block having a first dividing width along a second direction which is perpendicular to the first direction, (b) dividing a remaining block portion of the arbitrary block excluding the first block in the first direction to obtain a first divided portion having a second dividing width along the second direction, and merging the first dividing portion to the first block if the second dividing width is less than a predetermined width, and (c) searching the first block in the first direction after the step (b) and merging one of two adjacent first patterns within the first block to a second block if a pattern interval which is less than a predetermined value extends along the first direction between the first patterns.

18 Claims, 31 Drawing Sheets

|    |    |    |    |    |    |    |    |
|----|----|----|----|----|----|----|----|
| 11 | 12 | 13 | 14 | 15 | 16 | 17 | 18 |
| 21 | 22 | 23 | 24 | 25 | 26 | 27 | 28 |
| 31 | 32 | 33 | 34 | 35 | 36 | 37 | 38 |
| 41 | 42 | 43 | 44 | 45 | 46 | 47 | 48 |
| 51 | 52 | 53 | 54 | 55 | 56 | 57 | 58 |
| 61 | 62 | 63 | 64 | 65 | 66 | 67 | 68 |
| 71 | 72 | 73 | 74 | 75 | 76 | 77 | 78 |
| 81 | 82 | 83 | 84 | 85 | 86 | 87 | 88 |

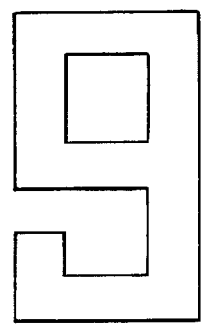  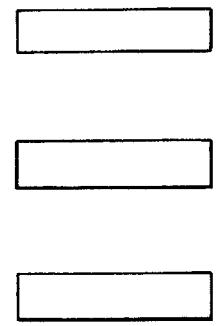 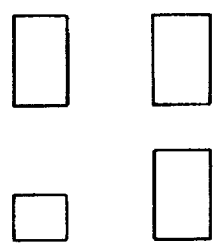
FIG.11(A)   FIG.11(B)   FIG.11(C)
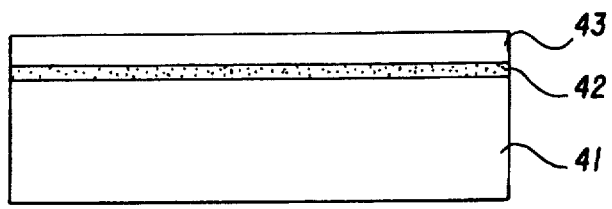
FIG.12(A)
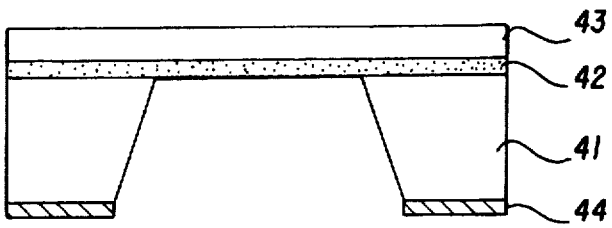
FIG.12(B)
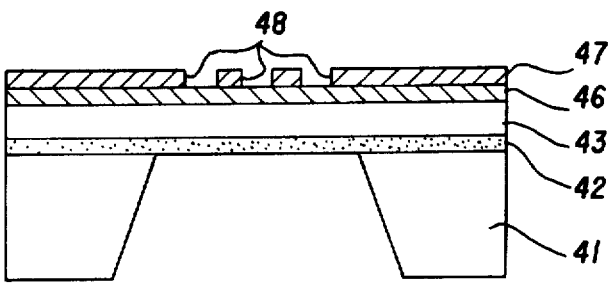
FIG.12(C)
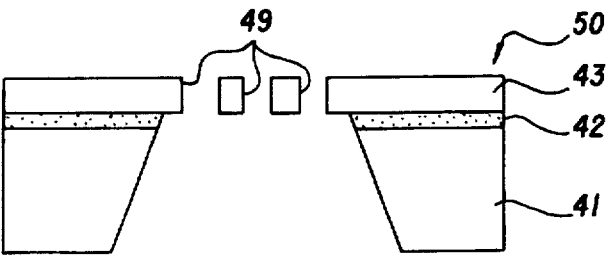
FIG.12(D)

FIG.35
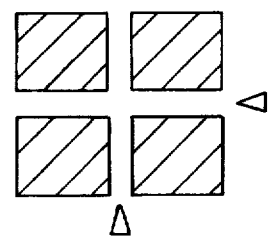
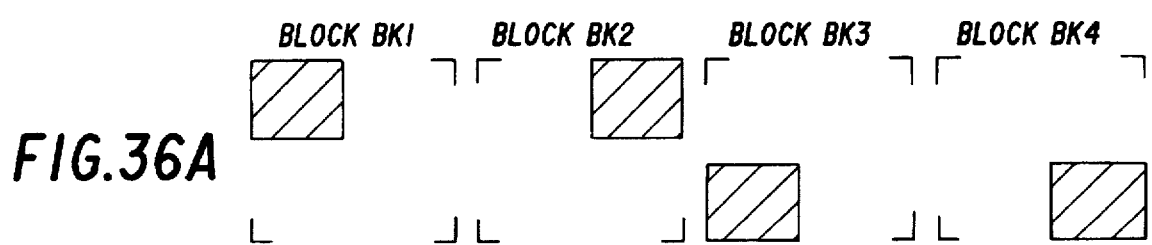
FIG.36A
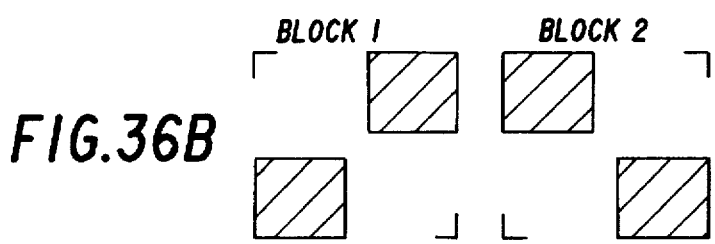
FIG.36B

FIG.37
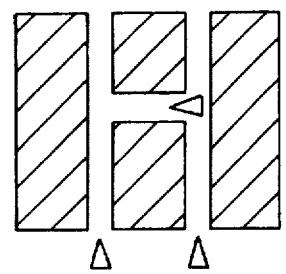
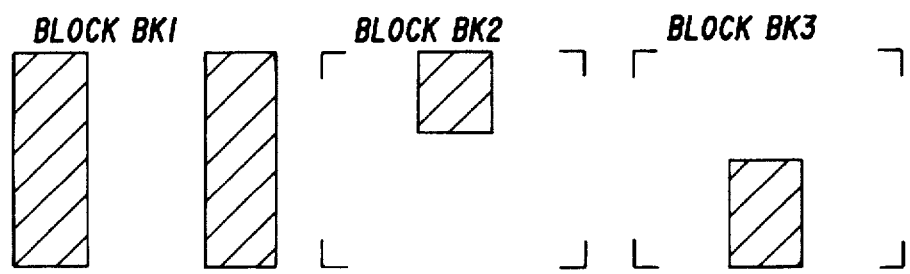
FIG.38A
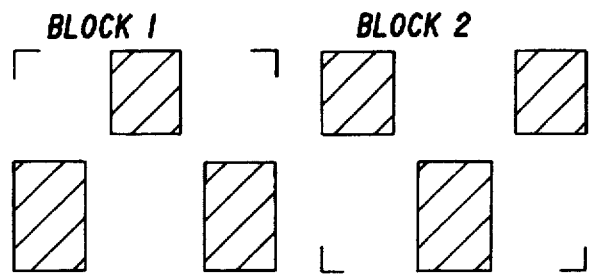
FIG.38B

PATTERN JUDGING METHOD, MASK PRODUCING METHOD, AND METHOD OF DIVIDING BLOCK PATTERN FOR USE IN BLOCK EXPOSURE

BACKGROUND OF THE INVENTION

This application is a Continuation-In-Part application of a U.S. patent application Ser. No. 917,260 filed Jul. 23, 1992, now U.S. Pat. No. 5,347,592.

The present invention generally relates to pattern judging methods and mask producing methods using the pattern judging method, and more particularly to a pattern judging method which judges whether or not a pattern may be arranged within a region of a mask which is used for a charged particle beam exposure and to a mask producing method which uses such a pattern judging method. The present invention also generally relates to methods of dividing block patterns, and more particularly to a method of dividing a block pattern for use in a block exposure which is one of exposure techniques employed when producing a semiconductor integrated circuit.

Recently, due to the further increase in the integration density of large scale integrated circuits (LSIs), charged particle beam exposure methods such as an electron beam exposure method is expected to replace the photolithography technique which was conventionally used to expose fine patterns. The charged particle beam exposure method has many advantageous features. First, the stable drawing of fine patterns and alignment accuracy can be controlled in a satisfactory manner. Second, a satisfactory focal depth is obtainable, and it is possible to guarantee no defects in the drawn patterns because no mask is used, thereby improving the reliability of the LSI. Third, it is possible to considerably improve the production yield at fine pattern regions of the LSI.

Therefore, the charged particle beam exposure method is characterized in that rectangular shots of the charged particle beam are made on an object surface and fine patterns on the order of microns or less can be drawn on the object surface. However, the charged particle beam exposure method draws the patterns by connecting the rectangular shots, and the patterns are drawn by a single stroke of the charged particle beam. As a result, the number of shots per unit area increases considerably as the size of the patterns decreases, and the throughput becomes poor when drawing the fine patterns.

On the other hand, in many situations, the patterns to be exposed include repeating patterns. Hence, the so-called block exposure method was developed. This block exposure method uses a mask which includes a plurality of openings for exposing basic patterns in a single shot of the charged particle beam which has a rectangular cross section, where the basic pattern forms a unit of the repeating pattern within the patterns which are to be drawn. According to the block exposure method, the basic patterns are repeatedly exposed and connected, so that the desired patterns are exposed at a high speed.

The mask which is provided with the openings corresponding to the basic patterns are often referred to as a block mask or a stencil mask, and the basic patterns are arranged in blocks of the block mask. For example, the basic patterns have rectangular or triangular shapes, so that the cross section of the charged particle beam transmitted through the opening of the block mask is shaped into such shaped. Further, the cross section of the charged particle beam transmitted through the opening of the block mask can be varied by partially or totally irradiating the opening by the charged particle beam. When making the block mask, it is essential that the openings corresponding to the basic patterns have shapes which are not easily damaged.

For example, the block exposure method which uses the block mask is proposed in a Japanese Laid-Open Patent Application No. 52-119185. In addition, the exposure method which uses the block mask provided with openings corresponding to repeating patterns of a memory cell or the like and to general rectangular patterns is proposed in a Japanese Laid-Open Patent Application No. 62-260322, for example. Furthermore, the process of extracting the block pattern when making the data for use in the block exposure is proposed in a Japanese Laid-Open Patent Application No. 5-182899, for example.

The block exposure method is particularly effective when exposing patterns in which a majority of the exposing area is made up of a repetition of basic patterns. Hence, even for semiconductor devices such as a 64 Mbit dynamic random access memories (DRAMs) and 256 Mbit DRAMs which require extremely fine patterns, it is possible to obtain a satisfactory throughput which would enable mass production of such semiconductor devices by employing the block exposure method.

In order to efficiently carry out the exposure employing the block exposure method, openings corresponding to a plurality of basic patterns are provided in the block mask, and the opening corresponding to an arbitrary one of the basic patterns is selectively used. The opening is selected by deflecting the charged particle beam by a deflector having a relatively large deflection range, and the charged particle beam is deflected by a deflector having a relatively small deflection range if the charged particle beam is to partially irradiate the selected opening.

The shapes of the openings corresponding to the basic patterns must be limited to a certain extent, because some shapes cannot be realized on the block mask and the block mask will easily be damaged at parts where extremely complicated shapes are formed. In other words, not all kinds of basic patterns can be realized by use of the block mask. Conventionally, the shapes of the basic patterns obtained from the basic pattern data (block pattern data) are checked by the human eye to determine whether or not each pattern can be realized on the block mask and whether or not to allow each pattern to be provided on the block mask. Accordingly, it was conventionally necessary for an experienced and skilled operator to make the above check.

FIGS. 1(A) through 1(F) show examples of basic patterns which are prohibited from being provided on the block mask. In FIGS. 1(A) through 1(F), the basic patterns, that is, the openings in the block mask if provided thereon, are indicated by non-hatched portions while the parts of the block mask having no opening are indicated by hatching portions.

FIG. 1(A) shows a rectangular frame shaped basic pattern. In this case, an opening 111 is formed around a rectangular region 110. However, since the rectangular region 110 cannot connect to a part of the block mask, it is physically impossible to realize this basic pattern.

FIG. 1(B) shows a sideways U-shaped basic pattern. In this case, an opening 113 is formed adjacent to three sides of a rectangular tongue region 112. According to this basic pattern, there is a relatively long heat conduction path, and the basic pattern is easily damaged because the temperature at the rectangular tongue region 112 easily rises to a high temperature.

FIG. 1(C) shows a sideways C-shaped basic pattern. In this case, an opening 115 is formed adjacent to three sides of a rectangular region 114, and the remaining side of the rectangular region 114 connects to the surrounding via a narrow connecting part 114a. According to this basic pattern, the connecting part 114a is narrow and may not be able to sufficiently support the weight of the rectangular region 114.

FIG. 1(D) shows a basic pattern which corresponds to the surrounding of an L-shape. In this case, openings 117a and 117b surround an L-shaped region 116. According to this basic pattern, the L-shaped region 116 is narrow and is weak from the point of view of the tension introduced at this part.

FIG. 1(E) shows a basic pattern which is made up of two parallel bands. In this case, openings 119a and 119b sandwich a narrow band-shaped region 118. According to this basic pattern, the narrow band-shaped region 118 easily breaks.

FIG. 1(F) shows a basic pattern having the shape shown. In this case, openings 121a through 121d surround a narrow intersecting region 120. According to this basic pattern, the narrow intersecting region 120 easily breaks.

Conventionally, the above described basic patterns shown in FIGS. 1(A) through 1(F) which should be prohibited from being provided on the block mask are checked by the human eye. However, the conditions under which the basic patterns to be prohibited are judged by such a check cannot be indicated by numerical values because the check relies on the human eye, and the conventional check is totally dependent on the experience and skills of the operator who makes the check.

Therefore, there was a problem in that the basic patterns which may or may not be provided on the block mask cannot be judged objectively and accurately for all kinds of basic patterns. As a result, the basic patterns provided on the block mask may easily be damaged and broken due to heat and insufficient support, and on the other hand, the basic patterns which will not generate problems and may actually be provided on the block mask may be prohibited from being provided on the block mask as a result of the check which relies on the human eye.

SUMMARY OF THE INVENTION

Accordingly, it is a general object of the present invention to provide a novel and useful pattern judging method, a mask producing method using the pattern judging method, and a method of dividing block pattern, in which the problems described above are eliminated.

Another and more specific object of the present invention is to provide a pattern judging method to be implemented on a computer for automatically judging whether or not a pattern should be prohibited from being formed in a mask, comprising the steps of (a) dividing an area of the mask where a desired pattern is to be formed into a plurality of regions, (b) calculating a predetermined physical quantity for each of the regions for a case where one or a plurality of openings corresponding to the desired pattern are formed in the mask, and (c) prohibiting the desired pattern from being formed in the mask if the predetermined quantity calculated in the step (b) exceeds a threshold value for at least one of the regions. According to the pattern judging method of the present invention, it is possible to automatically make an objective judgement as to whether the desired pattern should be prohibited from being formed in the mask, and there is no need to rely on the experience and skills of the operator who conventionally made the judgement. In addition, the judgement is accurate.

Still another object of the present invention is to provide a mask producing method for producing a mask which is used for drawing patterns on an object by a charged particle beam transmitted through the patterns of the mask, comprising the steps of (a) extracting a pattern data related to a desired pattern which is to be formed in the mask, (b) dividing an area of the mask where the desired pattern is to be formed into a plurality of regions, (c) calculating a predetermined physical quantity for each of the regions for a case where one or a plurality of openings corresponding to the desired pattern are formed in the mask, based on the extracted pattern data, (d) judging whether or not the predetermined quantity calculated in the step (c) exceeds a threshold value for all of the regions, and (e) forming the one or plurality of openings corresponding to the desired pattern in the mask if the step (d) judges that the predetermined quantity does not exceed the threshold value for all of the regions. According to the mask producing method of the present invention, it is possible to form only those patterns which are judged objectively as being permitted on the mask, and thus, it is possible to prevent a pattern which would easily break or become damaged from being formed on the mask.

A further object of the present invention is to provide a method of dividing a block pattern for use in a block exposure, to be implemented on a computer, dividing an arbitrary block which is to be formed in a block mask that is used for the block exposure when the arbitrary block is judged as including a prohibiting pattern which is undesirable from a point of view of the block exposure, where the method comprises the steps of (a) dividing the arbitrary block in a first direction to obtain a first block having a first dividing width along a second direction which is perpendicular to the first direction, (b) dividing a remaining block portion of the arbitrary block excluding the first block in the first direction to obtain a first divided portion having a second dividing width along the second direction, and merging the first dividing portion to the first block if the second dividing width is less than a predetermined width, and (c) searching the first block in the first direction after the step (b) and merging one of two adjacent first patterns within the first block to a second block if a pattern interval which is less than a predetermined value extends along the first direction between the first patterns. According to the method of dividing the block pattern of to the present invention, it is possible to divide the block including the prohibiting pattern into blocks which may be provided in the block mask. In addition, since the blocks are not simply divided repeatedly, the number of blocks will not become large and the original significance of the block exposure will not be lost. Therefore, it is possible to improve both the productivity and quality of the semiconductor element.

Another object of the present invention is to provide the method of dividing the block pattern described third and immediately above, which further comprises the step of (d) dividing, after the step (b), a remaining block portion of the arbitrary block excluding the first block in the first direction to obtain a second divided portion having a third dividing width along the second direction, and merging the second divided portion to the second block. According to the method of dividing the block pattern of the present invention, the memory capacity required of a storage unit for storing the pattern data and the like when dividing the block may be relatively small, because the arbitrary block is only divided into two blocks, namely, the first and second blocks.

As a result, no complex control is required to control the read and write with respect to the memory unit.

Still another object of the present invention is to provide the method of dividing the block pattern described immediately above, which further comprises the step of (e) dividing the second divided portion within the second block in the second direction if a prohibiting pattern is included in the second block so as to obtain two second patterns, and merging one of the second patterns to the first block. According to the method of dividing the block pattern of the present invention, the memory capacity required of a storage unit for storing the pattern data and the like when dividing the block may be relatively small, because the arbitrary block is only divided into two blocks, namely, the first and second blocks. As a result, no complex control is required to control the read and write with respect to the memory unit.

A further object of the present invention is to provide the method of dividing the block pattern described third above, wherein pattern data related to the arbitrary block are managed using a division table, a block table and a pattern table when the arbitrary block is divided by the steps (a) through (e), the division table at least manages a number of dividing widths, each dividing width and a start pointer corresponding to each dividing width, the block table at least manages a block number for identifying each of the first and second blocks and a pattern pointer corresponding to each block number, and the pattern table manages at least the pattern data. According to the method of dividing the block pattern of the present invention, the control of a storage unit used for storing pattern data and the like when dividing the block is relatively simple because the block data and the like are managed by the tables.

Another object of the present invention is to provide the method of dividing the block pattern described third above, which further comprises the steps of (d) automatically judging whether or not the arbitrary block includes the prohibiting pattern prior to the step (a), and the step (d) comprises the sub steps of (d1) dividing an area of the block mask where a desired pattern is to be formed into a plurality of regions, (d2) calculating a predetermined physical quantity, based on a charged particle beam being irradiated in a predetermined pattern formed in each of the regions where one or a plurality of openings corresponding to the predetermined pattern are formed in the block mask, and (d3) judging that the desired pattern includes a prohibiting pattern if the predetermined quantity calculated in the sub step (d2) exceeds a threshold value. According to the method of dividing the block pattern of the present invention, it is possible to provide on the block mask a pattern which would otherwise be determined as a prohibiting pattern in the step (d).

Still another object of the present invention is to provide a block mask producing method for producing a block mask which is used for drawing patterns on an object by a charged particle beam transmitted through the patterns of the block mask, comprising the steps of (a) extracting a pattern data related to a desired pattern which is to be formed in the block mask, (b) dividing an area of the block mask where the desired pattern is to be formed into a plurality of regions, (c) calculating a predetermined physical quantity, based on the charged particle beam being irradiated in a predetermined pattern formed in each of the regions where one or a plurality of openings corresponding to the predetermined pattern are formed in the block mask, (d) determining whether or not the predetermined quantity calculated in the step (c) exceeds a threshold value for all of the regions, (e) forming the one or plurality of openings corresponding to the predetermined pattern in corresponding region of the block mask if the step (d) determines that the predetermined quantity does not exceed the threshold value for each of the regions, and (f) eliminating an arbitrary block including a prohibiting pattern and having the predetermined quantity which is calculated as exceeding the threshold value in the step (d), where the prohibiting pattern is undesirable on the block mask from a point of view of block exposure, and the step (f) comprises the sub steps of (f1) dividing the arbitrary block in a first direction to obtain a first block having a first dividing width along a second direction which is perpendicular to the first direction, (f2) dividing a remaining block portion of the arbitrary block excluding the first block in the first direction to obtain a first divided portion having a second dividing width along the second direction, and merging the first dividing portion to the first block if the second dividing width is less than a predetermined width, and (f3) searching the first block in the first direction after the sub step (f2) and merging one of two adjacent first patterns within the first block to a second block if a pattern interval which is less than a predetermined value extends along the first direction between the first patterns. According to the block mask producing method of the present invention, it is possible to produce a block mask capable of forming a pattern which would otherwise be considered as a prohibiting pattern.

Other objects and further features of the present invention will be apparent from the following detailed description when read in conjunction with the accompanying drawings.

BRIEF DESCRIPTION OF THE DRAWINGS

FIGS. 11(A) through 11(C) are plan views for explaining a method of dividing a basic pattern into groups of patterns;

FIGS. 12(A) through 12(D) are cross sectional views showing a stencil mask at essential stages of its production;

FIG. 35 is a diagram showing a block pattern including a prohibiting pattern;

FIGS. 36A and 36B are diagrams for comparing the divisions of the block shown in FIG. 35 by the two embodiments;

FIG. 37 is a diagram showing a block pattern including a prohibiting pattern; and FIGS. 38A and 38B are diagrams for comparing the divisions of the block shown in FIG. 37 by the two embodiments.

DESCRIPTION OF THE PREFERRED EMBODIMENTS

Figure 2:
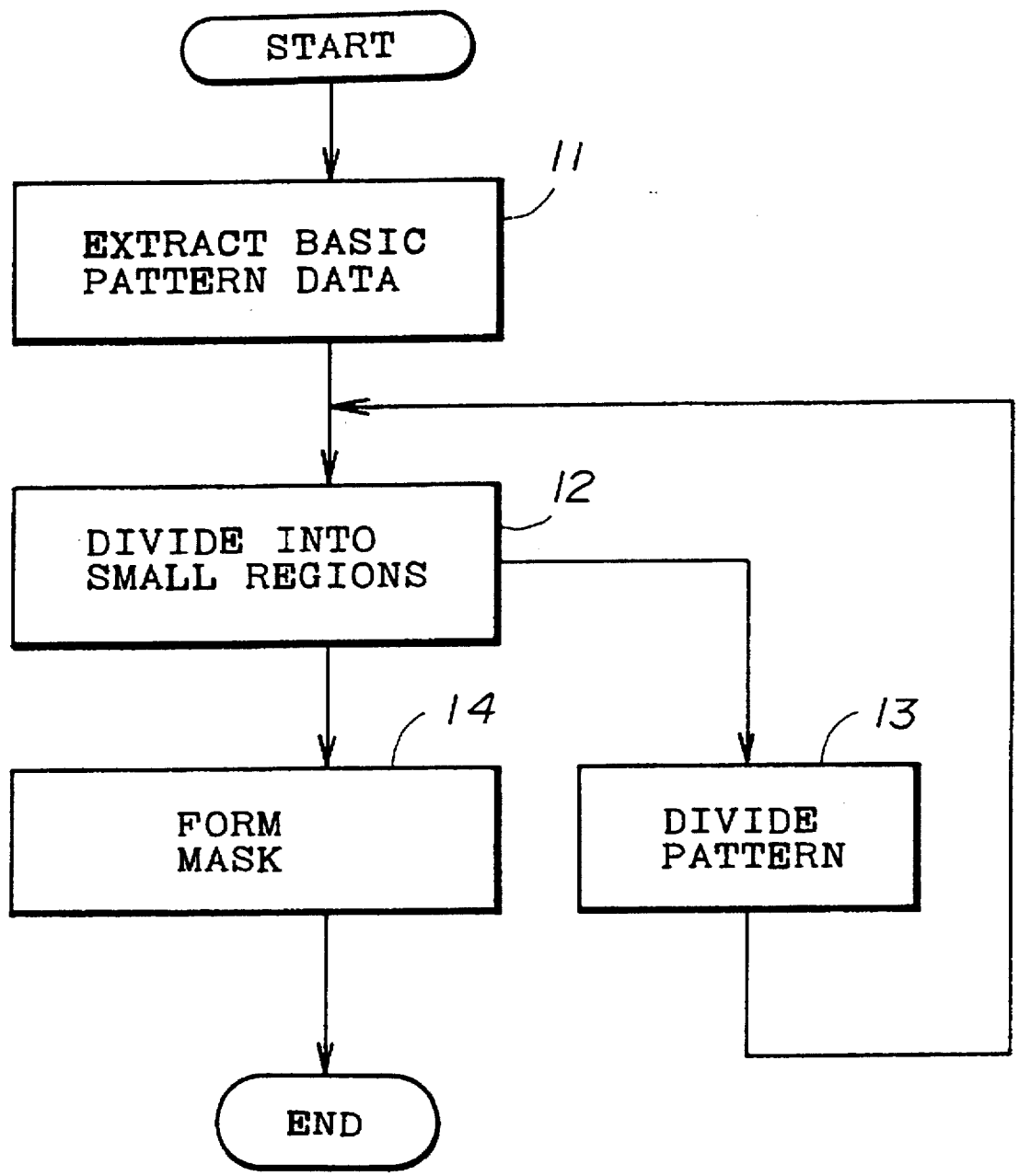
FIG. 2 is a flow chart for explaining the operating principle of the present invention.

First, a description will be given of the operating principle of the present invention, by referring to FIG. 2. FIG. 2 generally shows a mask producing method according to the present invention which uses a pattern judging method according to the present invention. The mask is provided with a plurality of openings corresponding to desired patterns, and is used for a charged particle beam exposure method. A charged particle beam is irradiated on the mask, and the charged particle beam transmitted through the opening exposes an object surface. By repeating this exposure process, it is possible to expose a repeating pattern on the object surface.

In FIG. 2, a first step 11 extracts data of basic patterns from a pattern data which is related to a pattern which is to be exposed. The basic pattern forms a pattern unit which is repeatedly used. A step 12 divides into a plurality of small regions the mask which would be formed if the openings of the basic patterns are provided based on the basic pattern data extracted in the step 11. In addition, the step 12 detects whether or not a predetermined physical quantity calculated for each of the divided regions is greater than or equal to a set value.

If the predetermined physical quantity is detected as being greater than or equal to the set value in the step 12, a step 13 in this case divides the basic pattern into two or more mutually independent patterns or, into one or more rectangular patterns and one arbitrary pattern. After dividing the basic pattern in the step 13, the process returns to the step 12 and the new patterns which are obtained by the division are respectively used as new basic patterns.

A step 14 forms the shape of the basic pattern on a mask based on the data of the basic pattern which is detected in the step 12 as having the predetermined physical quantity which is less than the set value for each of the small regions.

According to the present invention, it is judged that the basic pattern should be prohibited from being formed on the mask if the predetermined physical quantity of the small region is greater than or equal to the set value. In other words, the present invention uses an objective judging condition, namely, whether or not the predetermined physical quantity is greater than or equal to the set value.

As one example of the predetermined physical quantity, there is a temperature rise which occurs when the charged particle beam is irradiated on the mask. The aspect of the pattern described by the temperature distribution when this temperature rise occurs generally matches the condition for prohibiting the formation of the pattern on the mask. In addition, it is important to know the temperature rise which occurs when the charged particle beam is irradiated on the mask.

Figure 3:
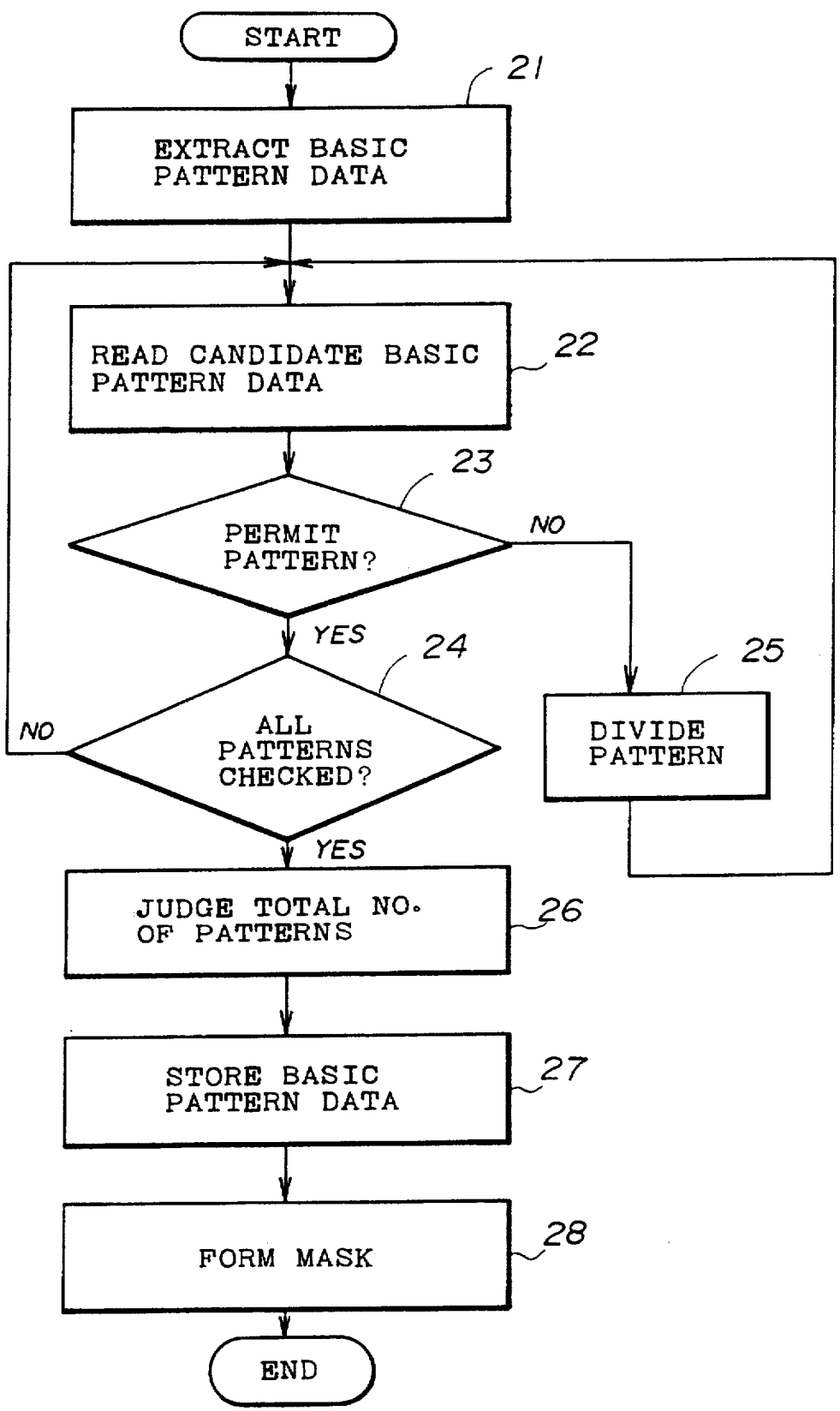
FIG. 3 is a flow chart for explaining an embodiment of a mask producing method according to the present invention.

Next, a description will be given of an embodiment of the mask producing method according to the present invention, by referring to FIG. 3. In FIG. 3, a step 21 extracts from the pattern data which is related to an LSI pattern data and is stored in a file the data which are related to the basic patterns that form the units which are repeatedly used. This step 21 corresponds to the step 11 shown in FIG. 2.

Then, out of the basic patterns indicated by each of the extracted basic pattern data, a step 22 reads out the data related to the candidate basic patterns in a sequence starting from the basic pattern having the largest product of the number of times the basic pattern is used within the LSI pattern which is to be exposed and the number of shots of an electron beam within the basic pattern. In this embodiment, the electron beam is used as the charged particle beam.

Figure 1D:
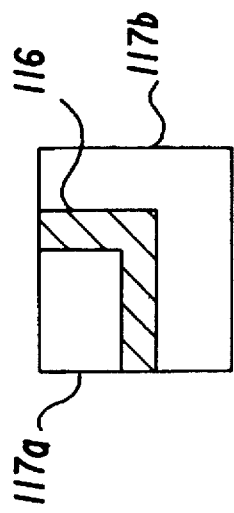
FIGS. 1(A) through 1(F) are plan views showing examples of basic patterns which should be prohibited from being provided on a block mask.
Figure 1E:
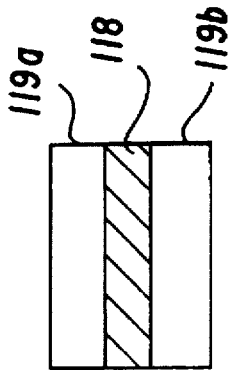
Figure 1F:
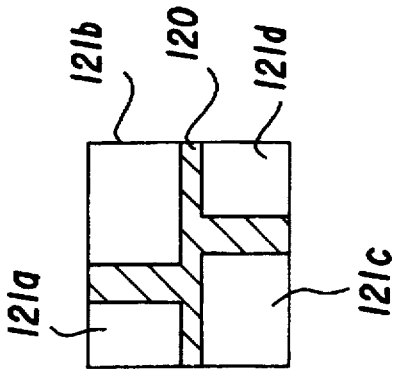
Figure 1A:
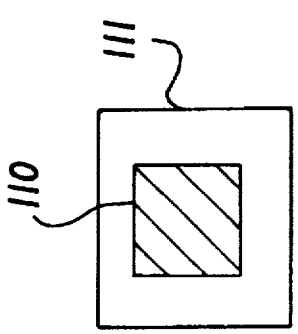
Figure 1B:
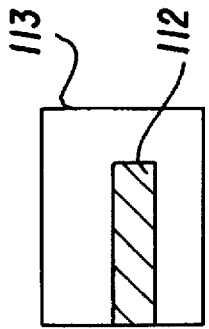
Figure 1C:
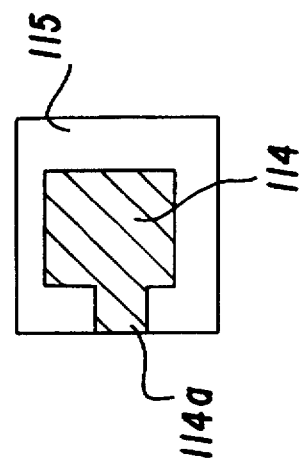

A step 23 decides whether or not the basic pattern should be permitted, that is, not be prohibited from being formed on a stencil mask, based on the candidate basic pattern data read out in the step 22. This step 23 of making the pattern prohibit check corresponds to the step 12 shown in FIG. 2. In this embodiment, the step 23 calculates the temperature rise which occurs when the electron beam irradiates the opening of the stencil mask corresponding to the candidate basic pattern, based on the candidate basic pattern data, and makes the above pattern prohibit check based on whether or not the calculated temperature rise is greater than or equal to a threshold value. In addition, the pattern such as that shown in FIG. 1(A) is also included in the prohibiting condition (Coulomb condition) which prohibits the pattern from being formed on the stencil mask.

In this embodiment, the temperature rise of the stencil mask is used as the physical quantity which determines the prohibiting condition, because the aspect of the patterns indicated by the temperature distribution generally matches other prohibiting factors.

Figure 4A:
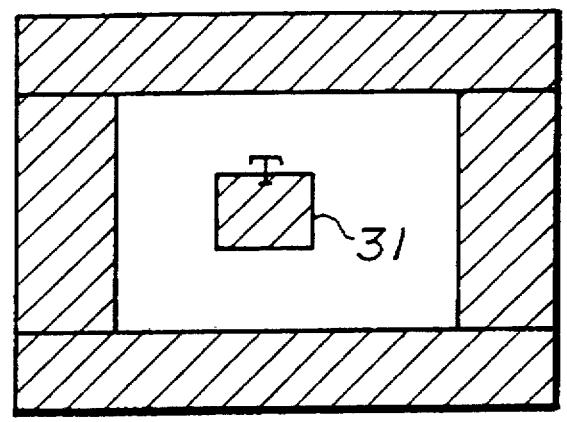
FIGS. 4A through 4C are plan views for explaining temperature rises which occur in the case of patterns which should be prohibited from being formed on a stencil mask.

For example, in the case of a pattern shown in FIG. 4A, the heat which is generated at a central rectangular region 31 which is indicated by the hatching due to the electron beam irradiation cannot be discharged to other regions indicated by the hatching, and as a result, a temperature T at the rectangular region 31 becomes high.

Figure 4B:
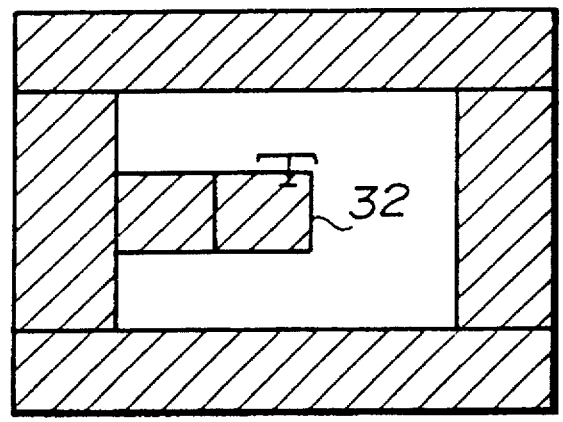

On the other hand, in the case of a pattern shown in FIG. 4B, the heat which is generated at a central rectangular tongue region 32 which is indicated by the hatching due to the electron beam irradiation can only discharge to the left connecting region indicated by the hatching, and the temperature T at the rectangular tongue region 32 also becomes high. Similar problems occur in the case of the patterns shown in FIG. 1(B), FIG. 1(C), FIG. 1(D) and FIG. 1(E).

Figure 4C:
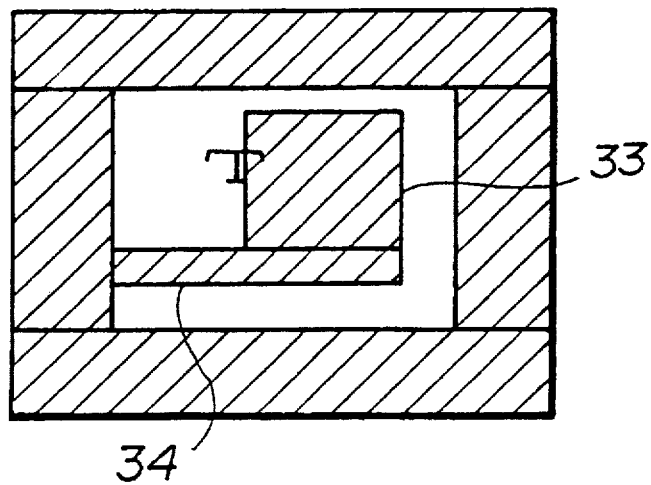

Furthermore, in the case of a pattern shown in FIG. 4C, a central rectangular region 33 which is indicated by the hatching is connected to the surrounding region indicated by the hatching via a narrow connecting part 34 which is indicated by the hatching. However, the connecting part 34 cannot support the weight of the rectangular region 33 if the connecting part 34 is narrow, and this pattern must be prohibited from being formed on the stencil mask. In this case, it becomes more difficult for the heat generated at the rectangular region 33 due to the electron beam irradiation to discharge as the connecting part 34 becomes narrower, and the temperature T at the rectangular region 33 becomes high.

Next, a more detailed description will be given of the step 23 shown in FIG. 3, that is, an embodiment of the pattern judging method according to the present invention, by referring to FIG. 5.

Figure 5:
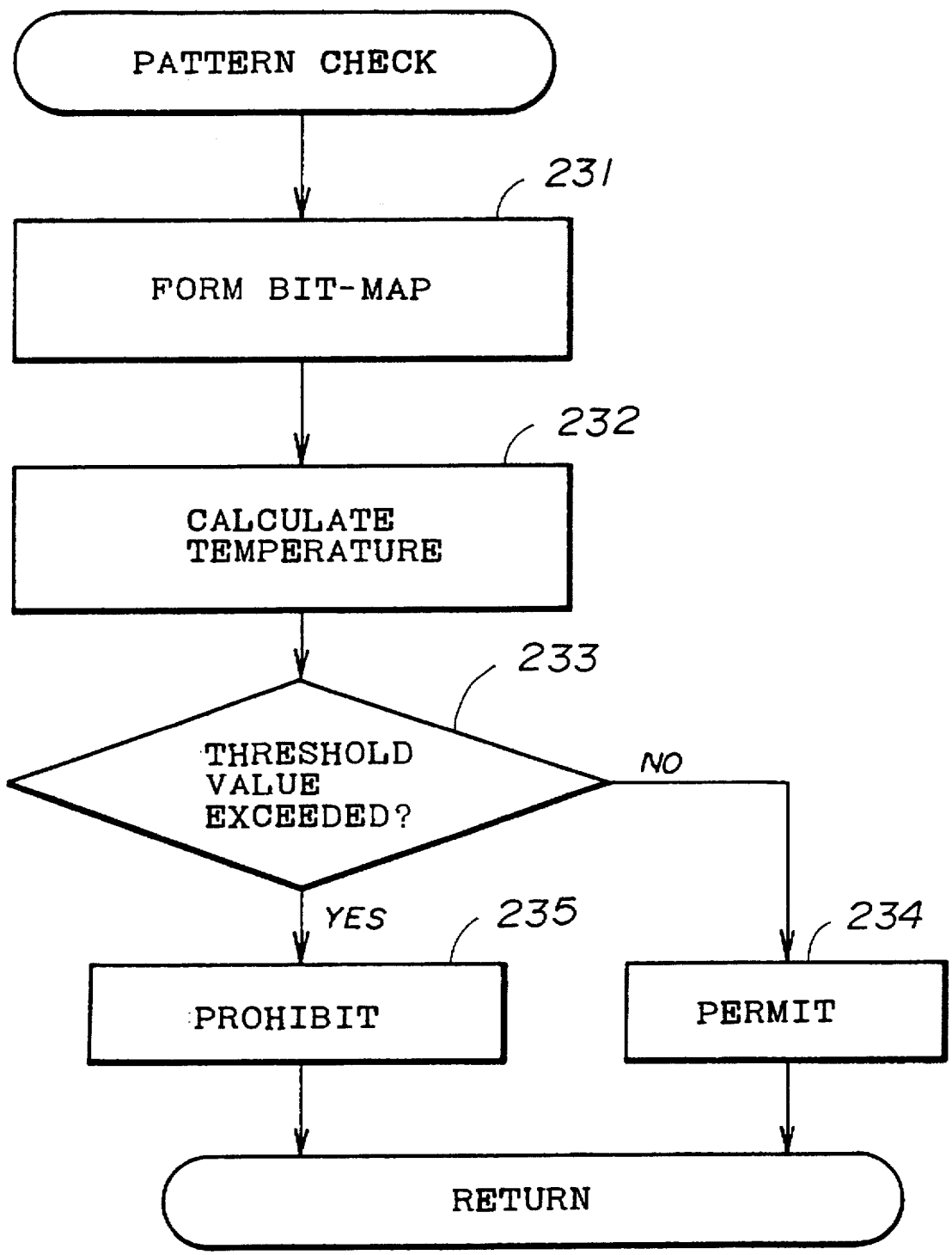
FIG. 5 is a flow chart for explaining an embodiment of a pattern judging method according to the present invention.

In FIG. 5, a step 231 divides the top surface of the stencil mask into a plurality of small regions and forms a bit-map of the openings of the candidate basic patterns which are to be formed on the stencil mask based on the candidate basic pattern data, where the bit-map describes each of the small regions by 1-bit.

Figures 6, 7:
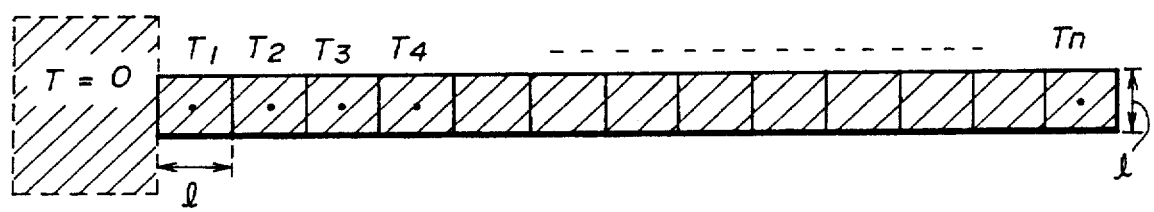
FIG. 6 is a plan view showing rectangular small regions of the stencil mask.
FIG. 7 is a plan view for explaining the temperature at various parts of an elongated plate shaped pattern of the stencil mask.

FIG. 6 shows the small regions of the stencil mask. In the case shown, the top surface of the stencil mask is divided into 8 small regions in the vertical direction and 8 small regions in the horizontal direction. More particularly, the size of each small region is 10 μm square. If the magnification of the stencil mask is 100 times, the size of the pattern exposed on the object surface is 0.1 μm square. Accordingly, a pattern region having the size of 400 μm square is divided into 1600 small regions (meshes) respectively having the size of 10 μm square and including 40 small regions arranged in the vertical direction and 40 small regions arranged in the horizontal direction.

If the pattern data is developed on the region of the stencil mask which is divided into the small regions, the bit-map is formed such that the small region is "0" if the opening exists at this small region, and the small region is "1" if the opening does not exist at this small region.

Returning now to the description of the pattern judging method shown in FIG. 5, a step 232 sets up an equation related to the thermal conduction for each of the small regions, and solves the simultaneous equation so as to calculate the temperature by the finite difference method. For example, as shown in FIG. 7, the temperature for the case where the electron beam is irradiated on an elongated plate shaped part of the stencil mask is denoted by $T_1, T_2, T_3, \ldots, T_n$ in a sequence starting from a leftmost square small region having a side of 1 μm, and the thickness of the stencil mask is denoted by t μm, where the temperature is taken at the center of each small region.

In this case, a heat quantity $q_1$ of the heat which flows to the left in FIG. 7 from the leftmost square small region can be described by the following if a heat value per unit square μm is denoted by q.

$$q_1 = KT_i = nq1^2$$

Similarly, heat quantities $q_2, \ldots q_n$ of the heat which flows to the left in FIG. 7 from the second, $\ldots$, nth leftmost square small regions can be described by the following, where k denotes the thermal conductivity.

$$q_2 = k(T_1 - T_2)t = (n-1)ql^2$$
$$\vdots$$
$$q_n = k(T_n - T_{n-1})t = ql^2$$

If the central terms and the right terms are all added, the following formulas are obtained.

$$kT_n t = q1^2 n(n+1)/2$$

$$T_n = q1^2 n(n+1)/2kt$$

If it is assumed that $q=3$ μW/μm$^2$, k (silicon)=168 μW/μmK and n1=L, the following formula can be derived.

$$T = 3L^2/300t = 0.01L^2/t$$

Hence, the following values can be calculated from the temperature T, for example.

$T=160°$ C. when $t=10$ μm and $L=400$ μm $T=40°$ C. when $t=10$ μm and $L=200$ μm $T=20°$ C. when $t=20$ μm and $L=400$ μm The heat quantity q per unit square μm can be obtained in the following manner. If it is assumed that the mask magnification is 100 times, 50% of the electrons passing through the stencil mask are cut by the round aperture, the current density on the object surface is 50 A/cm$^2$, the acceleration voltage is 30 kV and the thickness of the stencil mask is 20 μm, a current density J on the stencil mask becomes 0.01 A/cm$^2$ (=50×2×(10$^{-2}$)$^2$).

The wattage is 30 kV or, 300 W/cm$^2$ (=J×30000), and the heat quantity q per unit square μm can be described by the following formula.

$$q = 300 \times 10^{-8} \text{ W/μm}^2 = 3 \text{ μW/μm}^2$$

Figure 8:
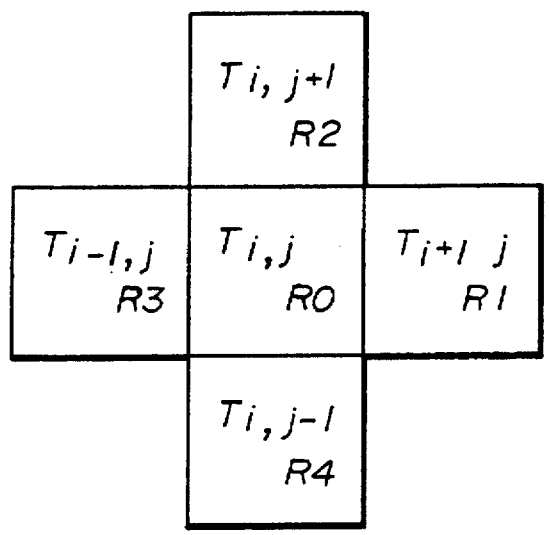
FIG. 8 is a diagram for explaining a computer simulation to calculate the temperature of each small region.

In this embodiment, the temperature for each of the small regions is calculated by computer simulation using the finite difference method. In other words, when obtaining a temperature $T_{i,j}$ of a region R0 in FIG. 8, a calculation shown in a formula (1) is made based on temperatures $T_{i+j}, T_{i,j+1}, T_{i-1,j}$ and $T_{i,j-1}$ of four regions R1, R2, R3 and R4 which are adjacent to the region R0, a thermal conductivity $K_i$ between the regions R0 and Ri (i=1, $\ldots$, 4), a length 1 of each side of the regions R0 through R4, a thickness t of the stencil mask and the heat value q per unit square μm.

$$K_1(T_{i,j} - T_{i+1,j}) + K_2(T_{i,j} - T_{i,j+1}) +$$
$$K_3(T_{i,j} - T_{i-1,j}) + K_4(T_{i,j} - T_{i,j-1}) = qI^2/t \quad (1)$$

If a pattern does not exist (that is, no opening exists) in the region R0 and a pattern exists (that is, an opening exists) in at least one of the adjacent regions R1 through R4, it is assumed for the sake of convenience that an extremely thin film exists in this region having the pattern (opening). Assuming that the adjacent region R1 includes the pattern (opening), $K_1$ in this case is set equal to $k/10^4$ where k denotes the thermal conductivity of the stencil mask.

The above measure is taken with respect to the adjacent region R1 because no solution can be obtained if the thermal conductivity $K_1$ between the region R0 including no pattern and the adjacent region R1 including the pattern is set to zero. By setting $K_1$ to an extremely small value $k/10^4$ which is essentially negligible, it becomes possible to obtain the solution.

On the other hand, if the pattern (opening) exists in the region R0, the heat value q on the right term of the formula (1) is set to zero and the thermal conductivities $K_1$ through $K_4$ for the adjacent regions R1 through R4 are respectively set to $k/10^4$.

Figure 9:
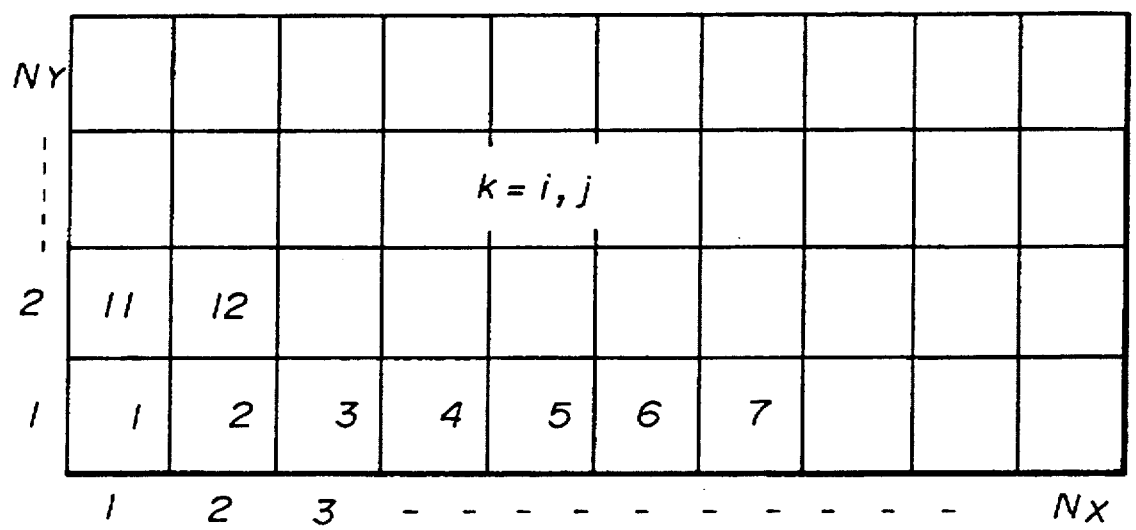
FIG. 9 is a diagram for explaining the rectangular small regions of the stencil mask.

Under such conditions, the formula (1) is calculated for each of the rectangular small regions which are made up of Ny (for example, 40) small regions arranged in the vertical direction and Nx (for example, 40) small regions arranged in the horizontal direction as shown in FIG. 9.

FIGS. 10(A) through 10(G) show typical examples of basic patterns, where parts of the stencil mask having no opening is indicated by hatching and thus the openings are indicated by non-hatched white portions. The formula (1) was calculated at a point x for each of the basic patterns shown in FIGS. 10(A) through 10(G) under the condition that t=20 μm, q=3 μW/μm², K=168 μW/μmK and the rectangular region (block) has an area of 400 μm square. The calculated maximum temperatures are as follows.

Figure 10A:
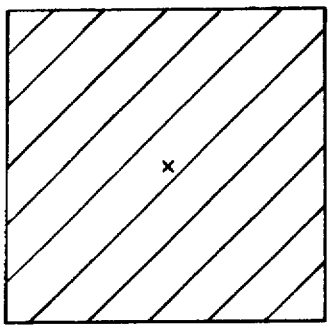
FIGS. 10(A) through 10(G) are plan views showing typical examples of the basic patterns.
Figure 10B:
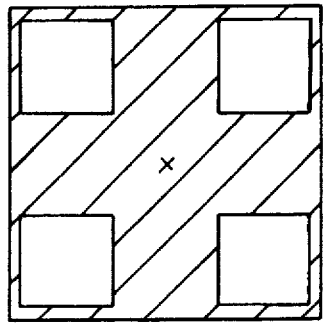
Figure 10C:
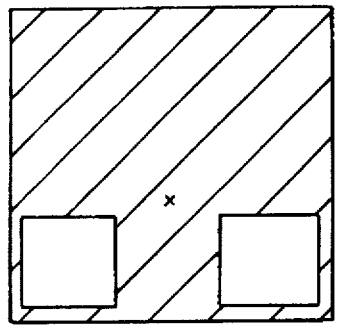
Figure 10D:
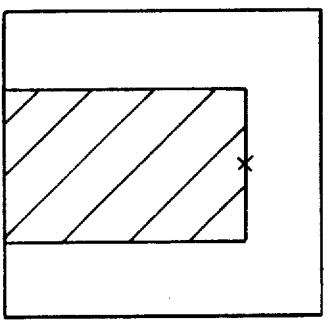
Figure 10E:
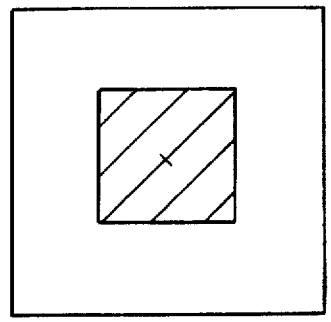
Figure 10F:
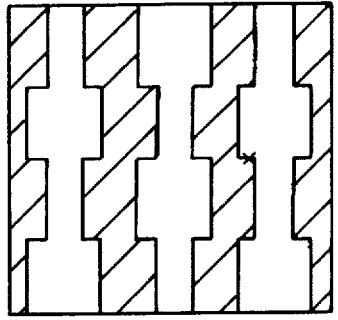
Figure 10G:
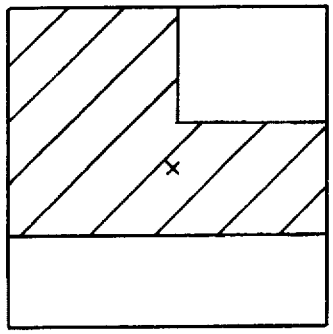

| FIG. 10(A) | $T = 11°$ C. |
| FIG. 10(B) | $T = 15.3°$ C. |
| FIG. 10(C) | $T = 12.6°$ C. |
| FIG. 10(D) | $T = 44°$ C. |
| FIG. 10(E) | $T = 36281°$ C. |
| FIG. 10(F) | $T = 22.88°$ C. |
| FIG. 10(G) | $T = 16.°$ C. |

In the case of the basic pattern shown in FIG. 10(A), the temperature at the point x is the lowest among the basic patterns shown in FIGS. 10(A) through 10(G) because no opening is formed and the generated heat conducts to the surrounding parts of the stencil mask. On the other hand, in the case of the basic pattern shown in FIG. 10(E), the heat at the point x cannot conduct to the surrounding parts of the stencil mask because the central rectangular region which includes the point x is completely surrounded by the opening. As a result, the temperature at the point x in FIG. 10(E) is extremely high.

In the case of the basic pattern shown in FIG. 10(D) which has the sideways U-shape, the temperature at a point x which is located at the tip end position of the rectangular tongue region is 44° C. at the maximum and relatively high. On the other hand, in the case of the basic patterns shown in FIGS. 10(B), 10(C), 10(F) and 10(G), the temperatures at points x are all 25° C. or less at the maximum.

Returning now to the description of the pattern judging method shown in FIG. 5, a step 233 decides whether or not the maximum temperatures which are calculated for each of the small regions in the step 232 is greater than or equal to a threshold value. For example, this threshold value is set to 30° C.

A step 234 judges that the basic pattern may be formed in the stencil mask if the decision result in the step 233 is NO, and in this case, the decision result in the step 23 is YES. But a step 235 judges that the basic pattern should be prohibited from being formed in the stencil mask if the decision result in the step 233 is YES, and in this case, the decision result in the step 23 is NO. Accordingly, if the threshold value is set to 30° C. for the basic patterns shown in FIGS. 10(A) through 10(G), the step 235 prohibits the basic patterns shown in FIGS. 10(D) and 10(E) from being formed in the stencil mask, while the step 234 permits the other basic patterns shown in FIGS. 10(A), 10(B), 10(C), 10(F) and 10(G) to be formed on the stencil mask.

Returning now to the description of the process shown in FIG. 3, a step 24 is carried out if the step 23 permits the basic pattern to be formed in the stencil mask. The step 24 decides whether or not all of the candidate basic patterns have been checked. The process returns to the step 22 if there is a next candidate basic pattern data which is to be checked and the decision result in the step 24 is NO, so as to repeat a process similar to that described above with respect to the next candidate basic pattern data.

On the other hand, a step 25 is carried out if the step 23 prohibits the basic pattern from being formed in the stencil mask. The step 25 divides the basic pattern, and each of pattern data related to divided portions of the basic pattern are input to the step 22 as the candidate basic pattern data.

The step 25 corresponds to the step 13 shown in FIG. 2. If the step 23 judges that the basic pattern shown in FIG. 11(A) should be prohibited from being formed in the stencil mask, the basic pattern is divided horizontally into a group of three rectangular patterns shown in FIG. 11(B) and is also divided vertically into a group of four rectangular patterns shown in FIG. 11(C). These two groups of mutually independent patterns shown in FIGS. 11(B) and 11(C) are stored in the memory as candidate basic patterns and read out when making the pattern judgement. Of course, the method of dividing the basic pattern which is prohibited from being formed in the stencil mask is not limited to that shown in FIGS. 11(A) through 11(C), and may be divided into one or a plurality of rectangular patterns and one other pattern.

When all of the candidate basic pattern data are checked, the decision results in the steps 23 and 24 are both YES, and a step 26 judges the total number of candidate basic patterns based on the candidate basic pattern data which are related to the basic patterns which are permitted to be formed in the reticle mask as a result of the pattern judgement. A step 27 stores in the memory the data related to a tolerable number of basic patterns which may be formed in the stencil mask.

If the total number of candidate basic patterns exceeds the tolerable number of basic patterns which may be formed in the stencil mask, those basic patterns which are most frequently used are selected and the data related thereto are stored in the memory with priority over other less frequently used basic patterns. Those basic patterns which are not selected and thus not formed in the stencil mask can be exposed using the exposure which varies the size of the exposed rectangular pattern by varying the area of the rectangular opening irradiated by the electron beam which has a rectangular cross section.

Finally, a step 28 reads out the basic pattern data from the memory, and forms in the stencil mask the openings which correspond to the basic patterns described by the basic pattern data. This step 28 corresponds to the step 14 shown in FIG. 2.

Next, a description will be given of the process of forming the stencil mask, by referring to FIGS. 12(A) through 12(D). First, a silicon dioxide (SiO$_2$) layer is formed on one of two mirror surfaces of a silicon (Si) wafer which has a thickness of 500 μm, and two such Si wafers are stacked at the SiO$_2$ layers and is subjected to a high voltage pulse under a high temperature condition of approximately 800° C. The two SiO$_2$ layers of the two Si wafers become bonded by electrostatic bonding. Thereafter, one of the two Si wafers is polished down to a thickness of 20 μm, so as to form a bonded wafer structure shown in FIG. 11(A). In FIG. 11(A), a first wafer 41 has a thickness of 500 μm, a second wafer 43 has a thickness of 20 μm, and an oxide (SiO$_2$) layer 42 is provided between the first and second wafers 41 and 43. In this case, the top surfaces of the first and second wafers 41 and 43 respectively correspond to the (111) face and the (100) face.

Thereafter, an etching mask which has a central opening and is made of a SiO$_2$ or a silicon nitride (Si$_3$N$_4$) layer is formed on the bottom surface of the first wafer 41, and a wet etching is carried out using an etchant such as potassium hydroxide (KOH). As a result, the etching progresses at a predetermined angle with respect to the bottom surface of the first wafer 41 corresponding to the (111) face, and the etching stops at the oxide layer 42 as shown in FIG. 11(B).

Then, as shown in FIG. 11(C), an oxide (SiO$_2$) layer 46 and a resist layer 47 are successively formed on the top surface of the second wafer 43, and the basic patterns are drawn on the resist layer 47 by the electron beam based on the basic pattern data which are stored in the memory in the step 27 shown in FIG. 3. After the resist layer 47 is developed, openings 48 corresponding to the basic patterns are formed by a patterning as shown in FIG. 11(C).

Next, the patterned resist layer 47 is used as a mask to remove a portion of the oxide layer 46. In addition, the resist layer 47 is removed, and further, the second wafer 43 is etched by use of the remaining oxide layer 46 as a mask and a predetermined etching gas such as HBr so as to form trenches. Finally, by removing the oxide layers 46 and 42, a stencil mask 50 shown in FIG. 11(D) is formed. As shown in FIG. 11(D), this stencil mask 50 has a thickness of 20 μm and is provided with openings 49 which correspond to the basic patterns.

Of course, the openings 49 of the stencil mask 50 may form only one kind of basic pattern. However, in order to efficiently carry out the exposure, a plurality of basic patterns are formed in the stencil mask 50.

Figure 13:
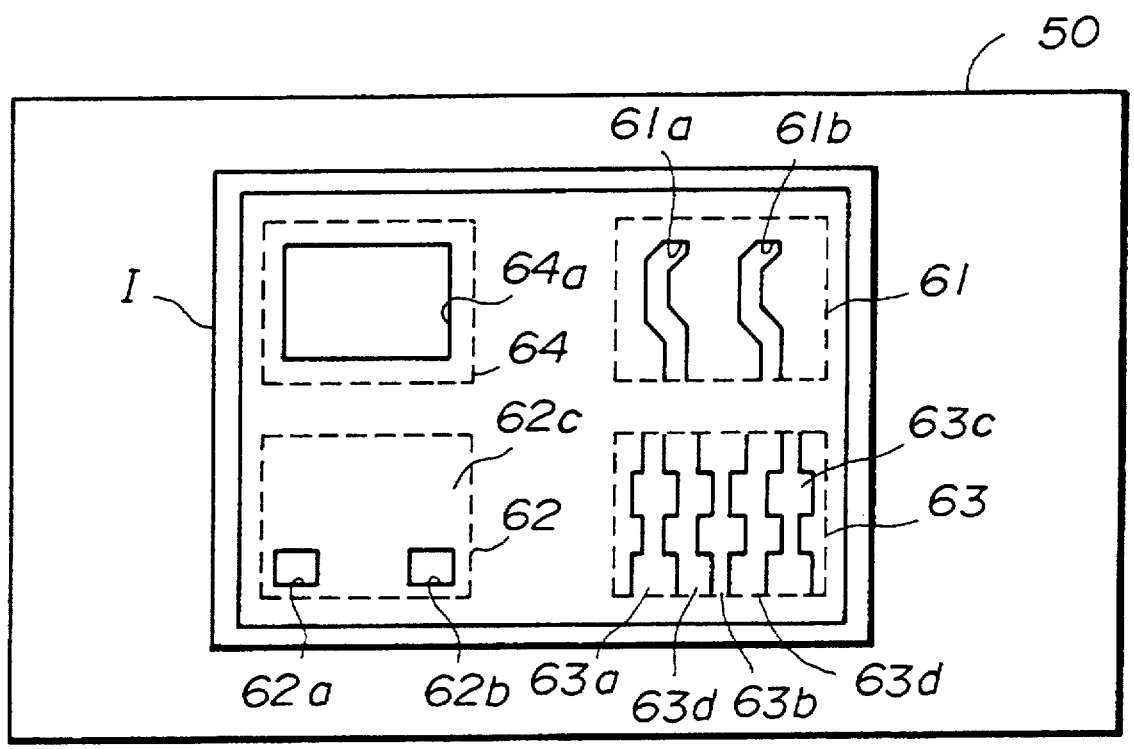
FIG. 13 is a plan view showing a stencil mask which is produced by the embodiment of the mask producing method according to the present invention.

FIG. 13 shows a stencil mask 50 which is produced by the embodiment of the mask forming method according to the present invention described above. This stencil mask 50 includes blocks 61 through 64.

The block 61 includes openings 61a and 61b which correspond to a basic pattern. The block 62 is made up of openings 62a and 62b which correspond to a basic pattern, and a region 62c in which no opening is formed. The block 63 is made up of openings 63a through 63c which correspond to a basic pattern, and a region 63d in which no opening is formed. Each basic pattern within one block can be drawn by one shot of the electron beam.

The block 64 includes a rectangular opening 64a. The rectangular opening 64a is used when making the exposure which varies the size of the exposed rectangular pattern by varying the area of the rectangular opening irradiated by the electron beam which has the rectangular cross section.

The group of patterns, that is, the four blocks 61 through 64, are arranged within a deflection region I in which the electron beam can be deflected. A plurality of such groups of patterns may be provided on the stencil mask 50 at predetermined intervals, but only one group of patterns is shown in FIG. 13 so as to simplify the drawing. Furthermore, one shot of the electron beam irradiates one block at one time, and the area irradiated by the electron beam is slightly greater than or equal to the area of one block indicated by a dotted line in FIG. 13.

Next, a description will be given of an application of the stencil mask 50 in an electron beam exposure apparatus shown in FIG. 14.

Figure 14:
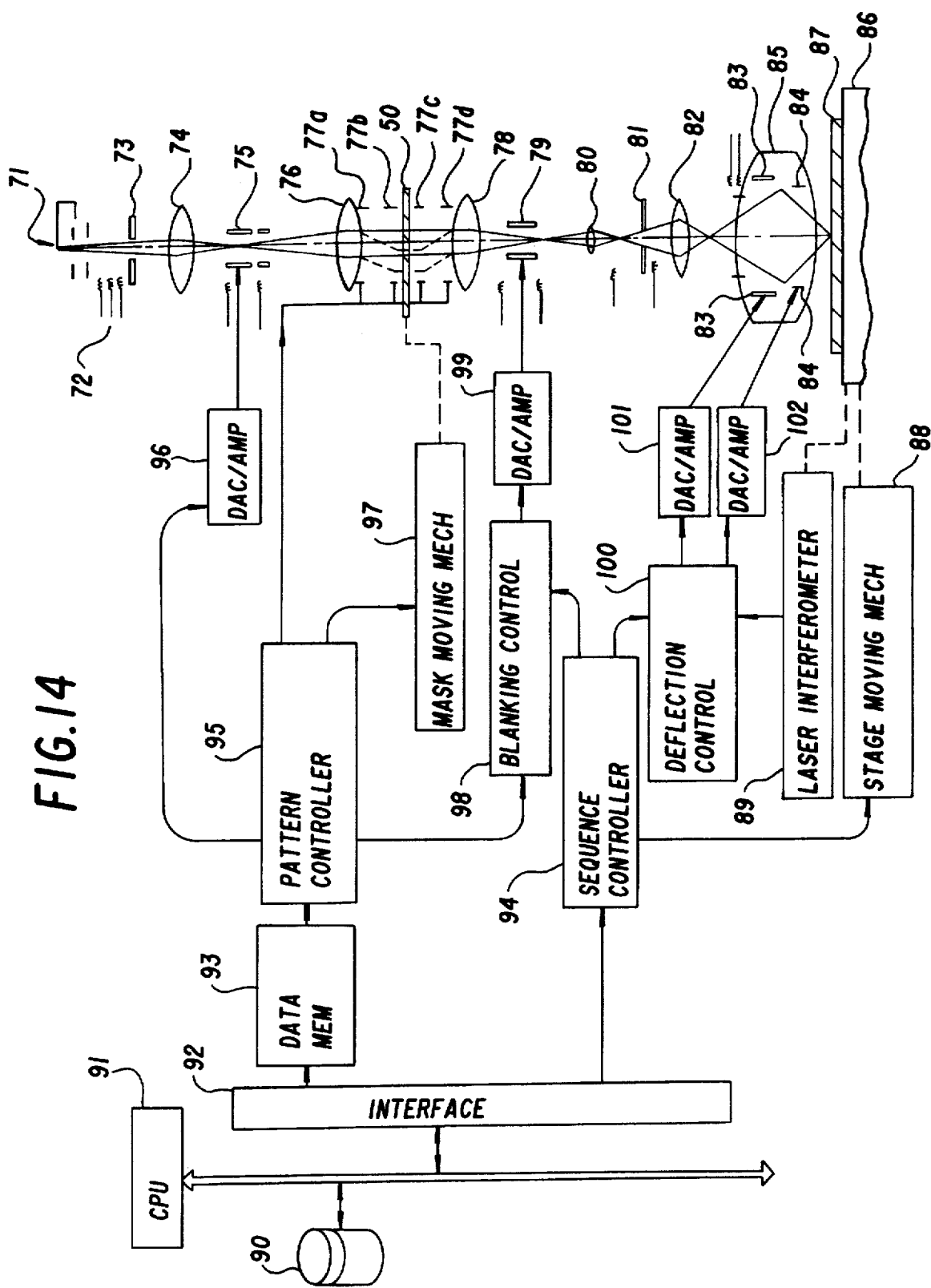
FIG. 14 generally shows an electron beam exposure apparatus to which the stencil mask produced by the present invention may be applied.

The electron beam exposure apparatus shown in FIG. 14 is provided within an electrostatic deflector means and an electromagnetic deflector means as the pattern select deflector means. The electromagnetic deflector means is used when selecting and exposing a basic pattern. On the other hand, the electrostatic deflector means is used when making the exposure which varies the size of the exposed rectangular pattern by varying the area of the rectangular opening irradiated by the electron beam which has the rectangular cross section.

In FIG. 14, an electron beam is emitted from an electron gun 71 as an example of the charged particle beam. The optical path of the electron beam is finely adjusted by alignment coils 72, and is shaped into an electron beam having a rectangular cross section by being passed through an aperture 73. The electron beam having the rectangular cross section is irradiated on the stencil mask 50 via an electron lens 74, a slit deflector 75, an electron lens 76 and alignment deflectors 77a and 77b.

The electron beam which is irradiated on the stencil mask 50 is deflected by the alignment deflectors 77a and 77b which are located on the upstream side relative to the stencil mask 50, so that the electron beam selectively irradiates only a selected one of the plurality of basic patterns provided on the stencil mask 50. The electron beam which is transmitted through the opening of the stencil mask 50 corresponding to the selected basic pattern is returned to its original optical axis by alignment deflectors 77c and 77d, and is directed to a reduction lens 80 via an electron lens 78 and a blanking deflector 79. The reduction lens 80 reduces the cross sectional area of the electron beam by 1/100, for example, and is passed through an aperture 81 and an electron lens 82 so as to be subjected to a focal correction. Thereafter, the electron beam reaches a projection lens 85.

The projection lens 85 includes a main deflector 83 which corresponds to the electromagnetic deflector mans, and a sub deflector 84 which corresponds to the electrostatic deflector means. The projection lens 85 irradiates the electron beam which has a cross sectional shape corresponding to the selected basic pattern at a specified position on an object 87 which is placed on a stage 86. For example, the object 87 is a semiconductor wafer. The stage 86 is movable by a stage moving mechanism 88, and the position of the stage 86 is measured by a laser interferometer 89.

On the other hand, a memory unit 90 stores exposure data related to patterns which are to be drawn on the object 87. The stored exposure data is read out from the memory unit 90 under a control of a central processing unit (CPU) 91, and is stored in a data memory 93 via an interface circuit 92 on one hand, and is input to a sequence controller 94 on the other.

The data memory 93 stores data related to the shapes of the block patterns, and the data read out from the data memory 93 is input to a pattern controller 95. The pattern controller 95 generates a pattern data for selecting the basic pattern of the stencil mask 50 based on the data read out from the data memory 93. The pattern data generated by the pattern controller 95 is input to the alignment deflectors 77a through 77d, and to the slit deflector 75 via a digital-to-analog converter and amplifier (DAC/AMP) 96.

At the same time, the pattern data from the pattern controller 95 is input to a mask moving mechanism 97 to control the position of the stencil mask 50. As a result, the electron beam is selectively irradiated on only the opening of the stencil mask 50 corresponding to the selected basic pattern out of the basic patterns provided on the stencil mask 50. In addition, the pattern data is input to the blanking deflector 79 via a blanking control circuit 98 and a DAC/AMP 99 to drive and control the blanking deflector 79.

On the other hand, a control signal from the sequence controller 94 is input to a deflection control circuit 100 so that the deflection control circuit 100 generates a deflection data for controlling the irradiating position of the electron beam on the object 87. This deflection data is input to the main deflector 83 via a DAC/AMP 101 to drive and control the main deflector 83, so that the electron beam is deflected to a predetermined position within a large deflection range.

At the same time, the above deflection data is input to the sub deflector 84 via a DAC/AMP 102 to drive and control the sub deflector 84, so that the electron beam is deflected to a predetermined position within a small deflection range. In this state, the movement of the stage 86 is controlled by the sequence controller 94 via the stage moving mechanism 88.

The position of the stage 86 is measured by the laser interferometer 89 and position information output from the laser interferometer 89 is input to the deflection control circuit 100. Hence, the electron beam is irradiated at a predetermined position on the object 87. Therefore, the selected basic pattern is exposed on the object 87 by one shot of the electron beam, and by connecting such shots on the object 87, it is possible to draw on the object 87 a repeating pattern which is a repetition of the basic pattern.

In the embodiment described heretofore, the physical quantity of the small region, calculated when making the pattern check, is the temperature rise of the stencil mask that occurs when the electron beam irradiates the stencil mask. However, the physical quantity is not limited to that of the described embodiment, and may be the strength of the stencil mask with respect to a load, the stress generated on the stencil mask and the like.

Figure 15A:
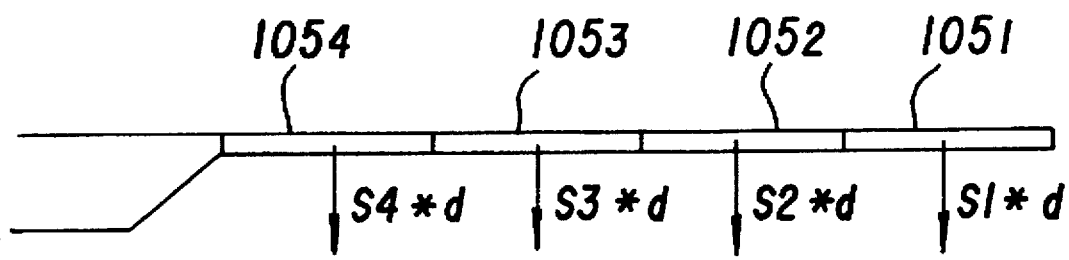
FIGS. 15(A) and 15(B) are diagrams for explaining the physical quantity which is used when making a pattern check.
Figure 15B:
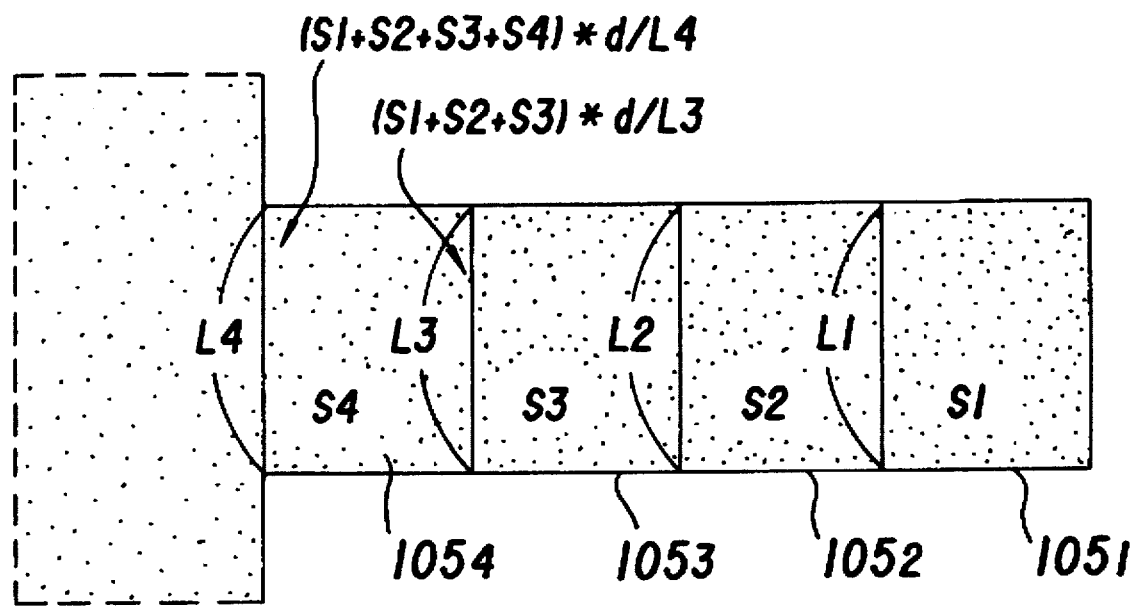

FIGS. 15(A) and 15(B) are diagrams for explaining a case where the strength of the stencil mask with respect to a load is used as the physical quantity when making the pattern check described above. FIG. 15(A) shows a side view of an important part of the stencil mask, and FIG. 15(B) shows a plan view of this stencil mask.

In the case shown in FIGS. 15(A) and 15(B), the elongated region of the stencil mask is divided into four rectangular regions $105_1$ through $105_4$, for example. If areas of these rectangular regions $105_1$ through $105_4$ are respectively denoted by S1 through S4 and a density of the stencil mask is denoted by d, the load at a boundary between the rectangular regions $105_3$ and $105_4$ and having a length L3 can be described by $(S1+S2+S3) \times d/L3$. Similarly, the load at a boundary between the rectangular region $105_4$ and the surrounding region and having a length L4 can be described by $(S1+S2+S3+S4) \times d/L4$ which is the maximum load within the elongated region.

Therefore, in the step 23 shown in FIG. 3, it is possible to decide whether or not the basic pattern defined by the elongated region shown in FIGS. 15(A) and 15(B) should be prohibited from being formed in the stencil mask, by calculating the maximum load acting within the elongated region and prohibiting the basic pattern if the calculated maximum load exceeds a predetermined threshold value.

Of course, the pattern check in the step 23 shown in FIG. 3 may be based on one or a plurality of such physical quantities.

Figure 16:
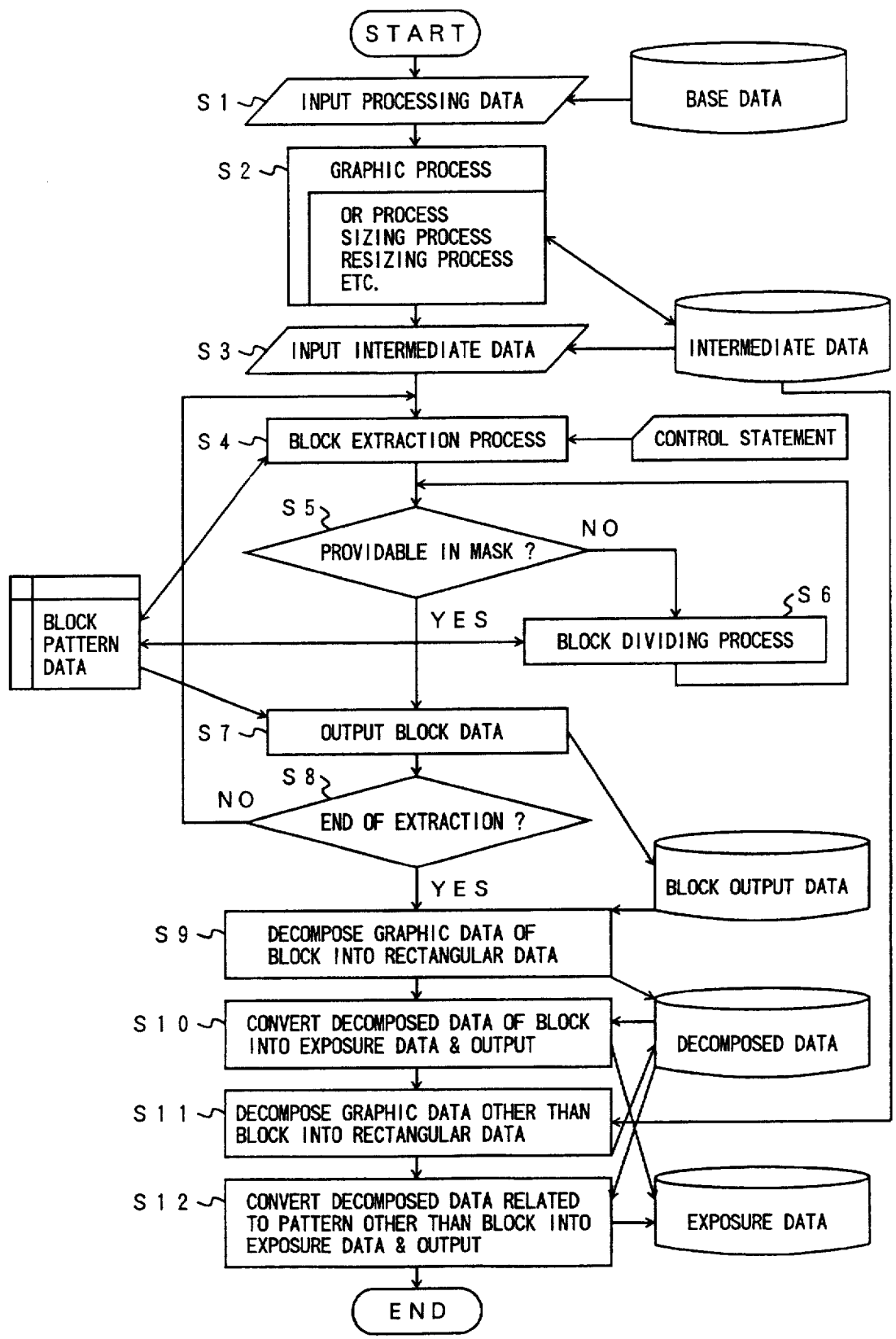
FIG. 16 is a flow chart for explaining the process of forming the block exposure data.

Next, a description will be given of the process of making the block exposure data, by referring to FIG. 16. The block exposure data are the data which are used at the time of the block exposure. The process shown in FIG. 16 may be carried out by the CPU 91 shown in FIG. 14 or, by another CPU such as a microprocessor unit (MPU, not shown) which is used exclusively for making the block exposure data. In FIG. 16, steps S4 through S10 relate to processes peculiar to the block exposure, and the other steps are substantially common to the process of making the normal exposure data.

In FIG. 16, a step S1 inputs processing data based on base data which are stored in a storage unit such as the memory unit 90 shown in FIG. 14. A step S2 carries out a graphic process such as an OR process, a sizing process and a resizing process, and stores intermediate data in the storage unit. In other words, the step S2 carries out the graphic process that is necessary to output the processing data as the exposure data. A step S3 inputs the intermediate data stored in the storage unit.

A step S4 carries out a block extracting process to extract a pattern group forming a repeating unit, based on an instruction by a control statement or the like, so as to obtain block pattern data. A step S5 decides whether or not the block pattern obtained in the step S4 can be provided in the block mask. In other words, the step S5 decides whether or not the block pattern includes a prohibiting pattern which should be prohibited from being provided in the block mask. This step S5 divides the block mask into a plurality of small regions, and automatically decides whether or not to prohibit formation of the opening of the block pattern based on the physical quantity that is calculated for each of the small regions, as done in the embodiment described above. If the decision result in the step S5 is NO, a step S6 carries out the process of dividing the block pattern as described above, and the process returns to the step S5. On the other hand, if the decision result in the step S5 is YES, a step S7 outputs the block pattern data including no prohibiting pattern, and stores the block pattern data in the storage unit. In addition, a step S8 decides whether or not the block extracting process has ended. The process returns to the step S4 if there exists another block to be extracted and the decision result in the step S8 is NO.

When the decision result in the step S8 becomes YES, a step S9 decomposes the block pattern data stored in the storage unit into rectangular data, and stores the rectangular data in the storage unit. A step S10 converts the decomposed rectangular data stored in the storage unit into the exposure data and stores the exposure data in the storage unit. In addition, a step S11 decomposes pattern data other than the block pattern into rectangular data, and stores the rectangular data in the storage unit. The pattern data other than the block pattern indicate data that are related to patterns which are not exposed by the block. A step S12 converts the decomposed rectangular data related to the pattern data other than the block pattern into exposure data, and stores the exposure data in the storage unit. The process of making the block exposure data ends after the above described process.

Figure 17:
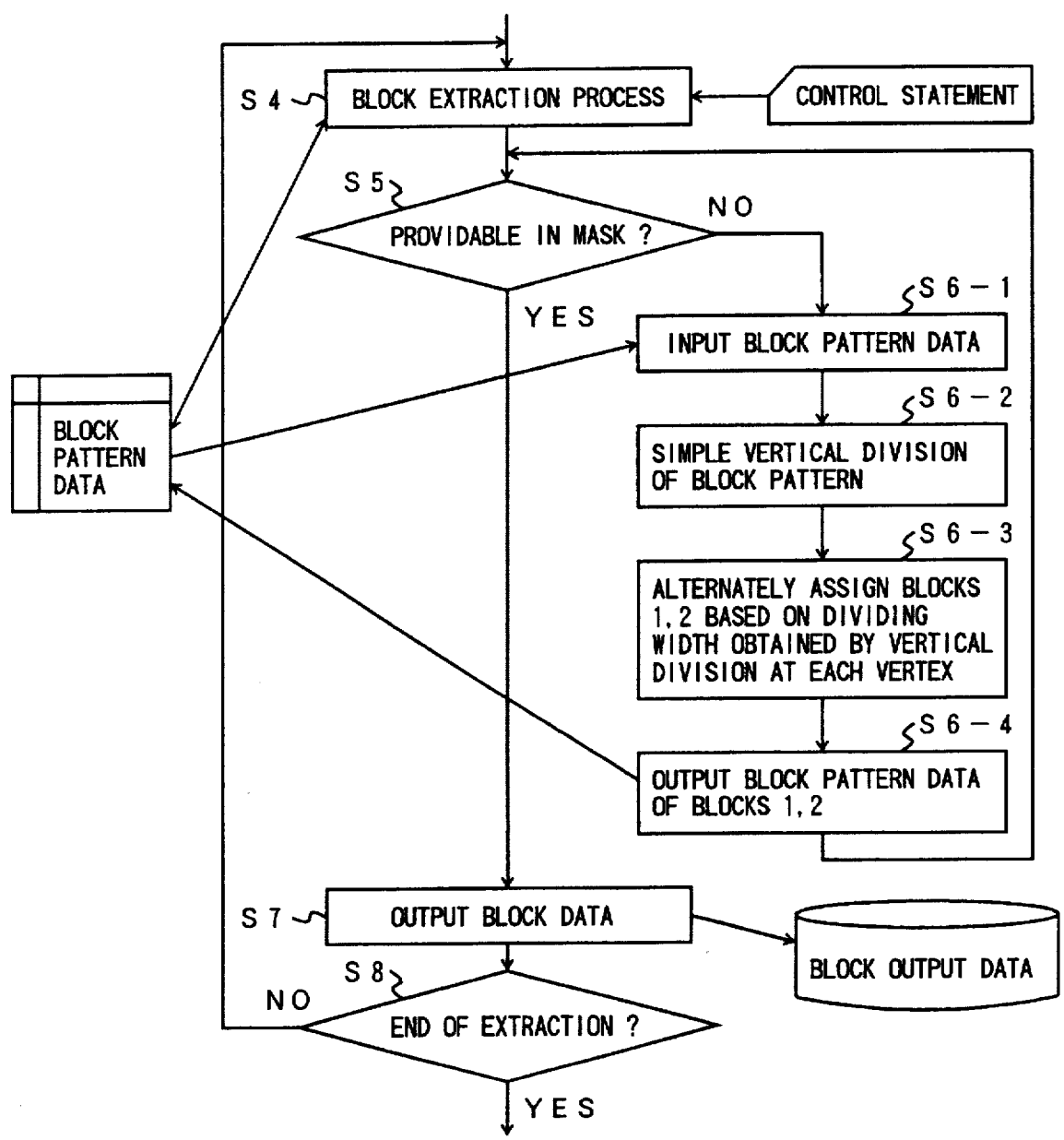
FIG. 17 is a flow chart for explaining in more detail the process of dividing a block in FIG. 16.

FIG. 17 is a flow chart showing in more detail the process of dividing the block pattern in FIG. 16. This process of dividing the block pattern is in accordance with the embodiment described above. In FIG. 17, steps S6-1 through S6-4 correspond to the step S6 shown in FIG. 16.

Figure 18A:
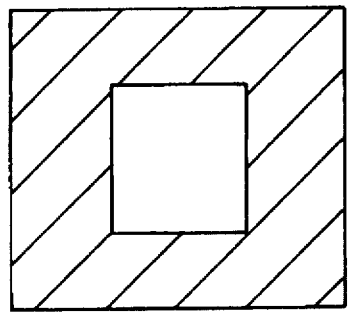
FIGS. 18A, 18B, 18C and 18D are diagrams for explaining the process of dividing the block in FIG. 17.
Figure 18B:
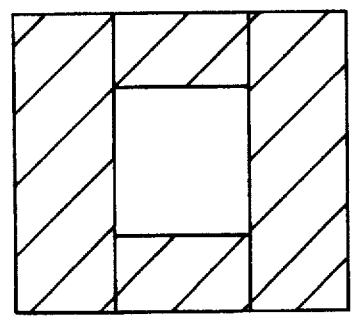

In FIG. 17, the step S4 extracts the block pattern data related to the block pattern shown in FIG. 18A, for example. The block pattern shown in FIG. 18A is essentially the same as the prohibiting pattern described above in conjunction with FIG. 1(A), and for this reason, the decision result in the step S5 becomes NO in this case. Accordingly, the step S6-1 inputs the block pattern data related to the block pattern shown in FIG. 18A. In addition, the step S6-2 vertically and simply divides the block pattern which is described by the input block pattern data from each vertex of the block pattern. As a result, the block pattern data related to the vertically and simply divided block pattern shown in FIG. 18B is obtained.

Figure 18C:
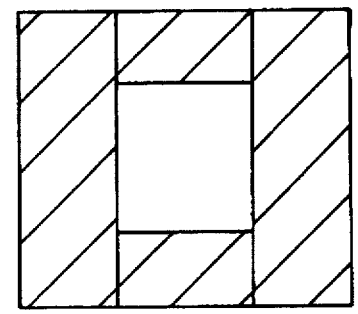
Figure 18C:
Figure 18D:
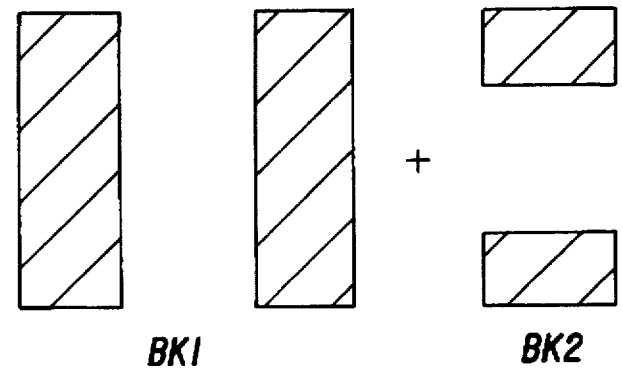

The step S6-3 assigns a block name BK1 to one of the 2 block portions forming the vertically and simply divided block pattern based on the respective widths, as shown in FIG. 18C. The step S6-4 outputs the block pattern data related to the block BK1, and the process returns to the step S5. In this case, the process is not carried out with respect to the other of the 2 block portions, and the decision result in the step S5 is NO. Hence, the steps S6-1 through S6-4 are repeated similarly as described above, the step S6-4 this time outputs the block pattern data related to a block BK2, and the process returns to the step S5. In this case, the decision result in the step S5 becomes YES, and the step S7 outputs the block pattern data related to the blocks BK1 and BK2 shown in FIG. 18D, and stores the block pattern data in the storage unit.

However, according to the method of simply dividing the block pattern as described above, it is impossible to perfectly prevent the prohibiting pattern. In addition, depending on the prohibiting pattern, it becomes necessary to repeatedly divide the block pattern, and the number of block pattern portions (or block patterns) finally obtained becomes large, thereby loosing the original significance of the block exposure. In other words, if the number of block patterns becomes large, the block exposure becomes not much different from the exposure technique which varies the cross sectional area of the charged particle beam by controlling the irradiating position of the charged particle beam relative to the opening in the mask, because the block exposure exposes 1 pattern by 1 block. As a result, the advantageous features of the block exposure such as the high-speed exposure, the high-precision exposure, and the effect of compressing the exposure data by the repeated use of the block pattern, will be lost if the number of block patterns becomes large.

Figure 19A:
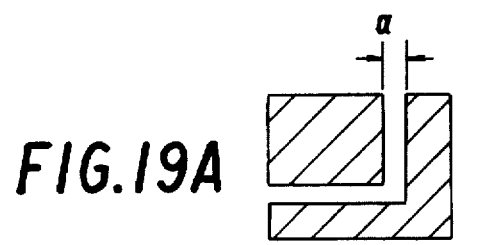
FIGS. 19A, 19B, 19C, 19D, 19E, 19F and 19G are diagrams for explaining the process of dividing the block in FIG. 17.
Figure 19B:
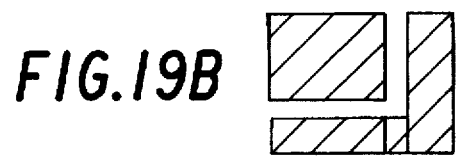
Figure 19C:
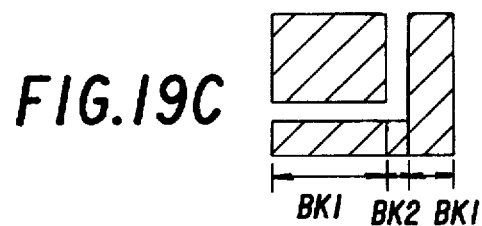

For example, suppose that the step S4 shown in FIG. 17 extracts the block pattern data related to the block pattern shown in FIG. 19A. This block pattern shown in FIG. 19A is essentially the same as the prohibiting pattern described above in conjunction with FIG. 1(D), and thus, the decision result in the step S5 becomes NO in this case. Hence, the step S6-1 inputs the block pattern data related to the block pattern shown in FIG. 19A. In addition, the step S6-2 vertically and simply divides block pattern described by the input block pattern from each vertex of the block pattern. As a result, the block pattern data related to the vertically and simply divided block pattern shown in FIG. 19B is obtained. The step S6-3 assigns the block names BK1 and BK2 to the 2 block portions which form the block pattern and are obtained by the vertical and simple division made in the step S6-2, based on the respective widths, as shown in FIG. 19C. The step S6-4 outputs the block pattern data related to the blocks BK1 and BK2, and the process returns to the step S5.

Figure 19D:
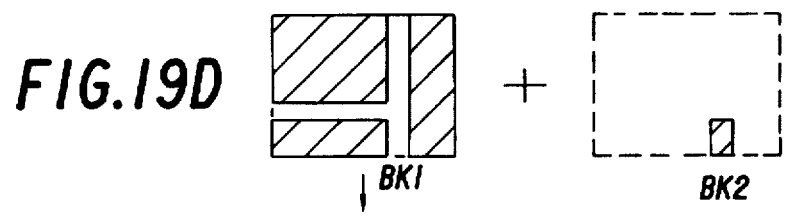

However, in this case, the block BK1 is still a prohibiting pattern as may be seen from FIG. 19D. Hence, the decision result in the step S5 is NO, and the steps S6-1 through S6-4 are repeated again. As a result, the block BK1 is further divided, and blocks BK-1 and BK-2 shown in FIG. 19E are obtained.

Figure 19E:
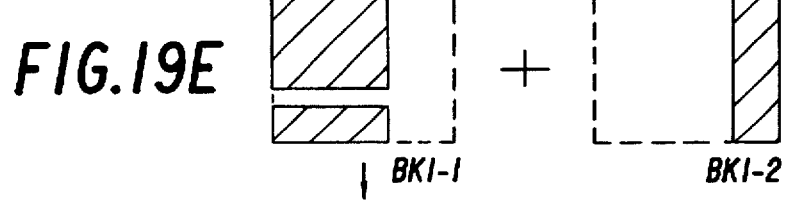

However, the block BK-1 is still a prohibiting pattern as may be seen from FIG. 19E. Hence, the decision result in the step S5 is NO, and the steps S6-1 through S6-4 are repeated again. Hence, the block BK-1 is further divided, and blocks BK1-1$a$ and BK1-1$b$ shown in FIG. 19F are obtained.

Figure 19F:
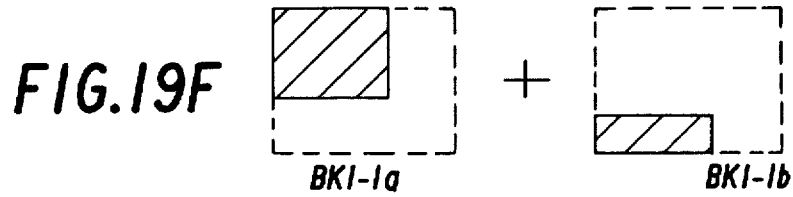
Figure 19G:
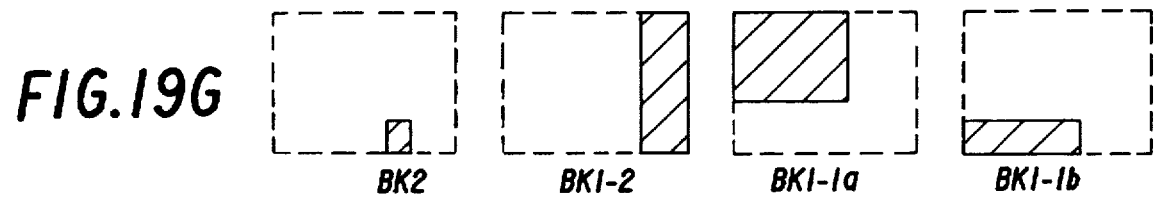

The blocks BK1-1$a$ and BK1-1$b$ shown in FIG. 19F are both not a prohibiting pattern. Thus, the decision result in the step S5 becomes YES, and the step S7 outputs and stores in the storage unit the block pattern data related to the blocks BK2, BK1-2, BK1-1$a$ and BK1-1$b$ shown in FIG. 19G.

As may be seen from FIGS. 19A through 19G, the embodiment described above may require the division of the block pattern to be repeated a plurality of times depending on the block pattern. Hence, the number of block patterns that are finally obtained may become large, and if this occurs, the original significance of the block exposure will be lost.

Accordingly, a description will be given of an embodiment of a method of dividing the block pattern according to the present invention, which can eliminate the possible problem of the above described embodiment. More particularly, the embodiment described hereunder enables division of a block pattern including a prohibiting pattern into block patterns which can be provided in the block mask, while maintaining the advantageous features of the block exposure such as the high-speed exposure, the high-precision exposure, and the effect of compressing the exposure data by the repeated use of the block pattern.

Figure 20:
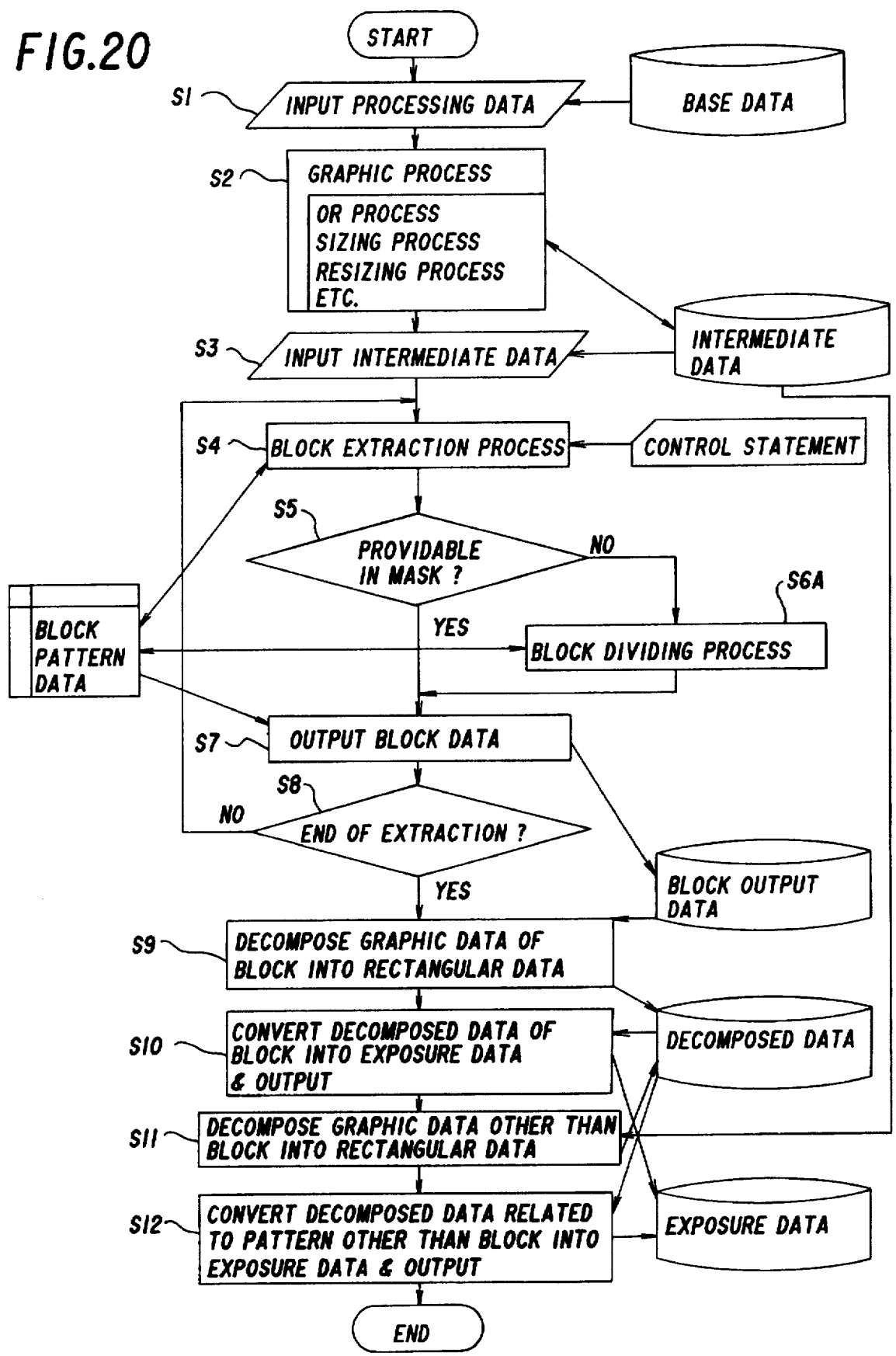
FIG. 20 is a flow chart showing a process of making the block exposure data to which an embodiment of a method of dividing the block pattern according to the present invention is applied.

FIG. 20 is a flow chart showing the process of making the block exposure data, applied with the embodiment of the method of dividing the block pattern according to the present invention. In FIG. 20, those parts which are the same as those corresponding steps in FIG. 16 are designated by the same reference numerals, and a description thereof will be omitted. In FIG. 20, a step S6A forms an important part of this embodiment.

Figure 21:
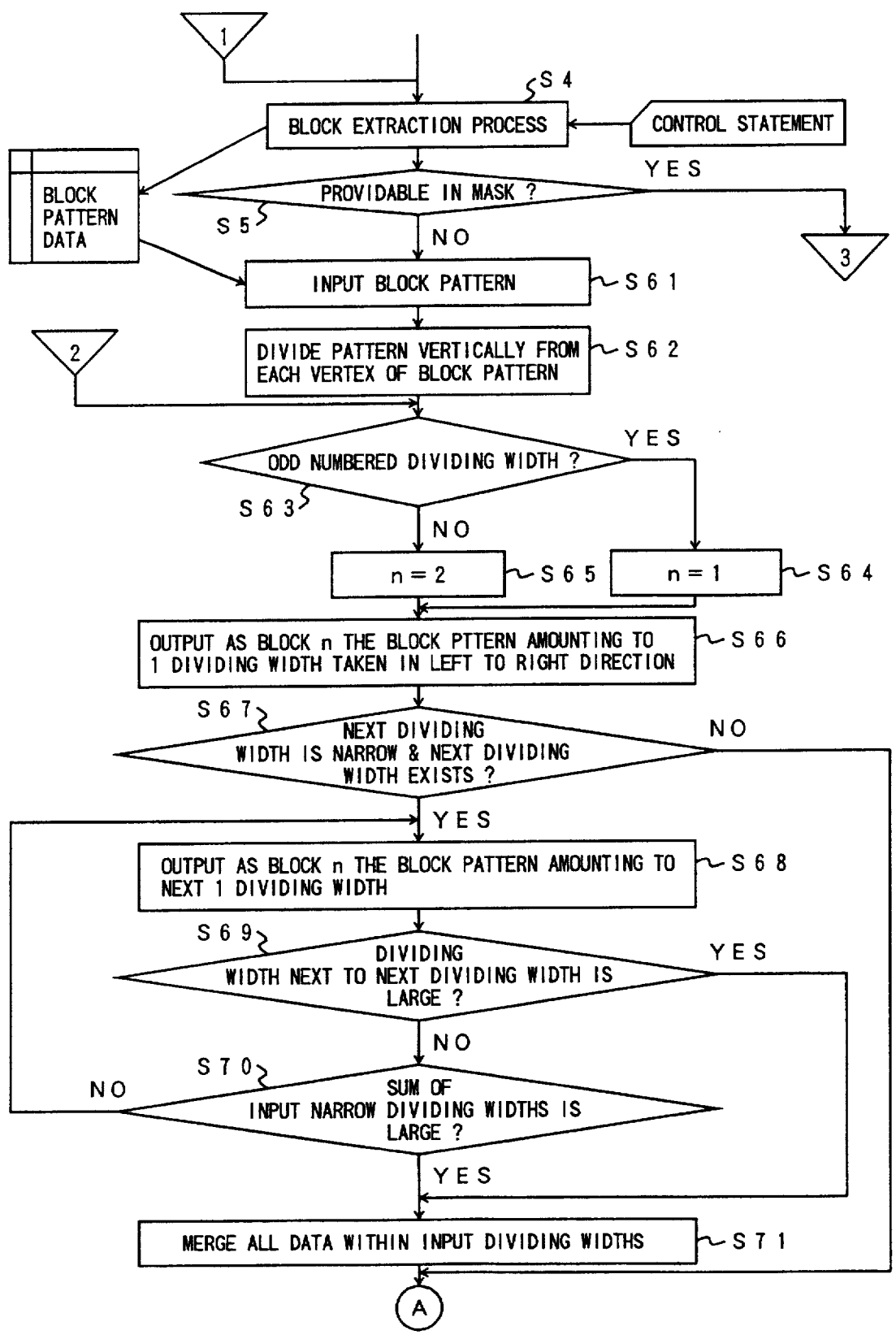
FIGS. 21 and 22 respectively are flow charts for explaining the embodiment of the method of dividing the block pattern according to the present invention.
Figure 22:
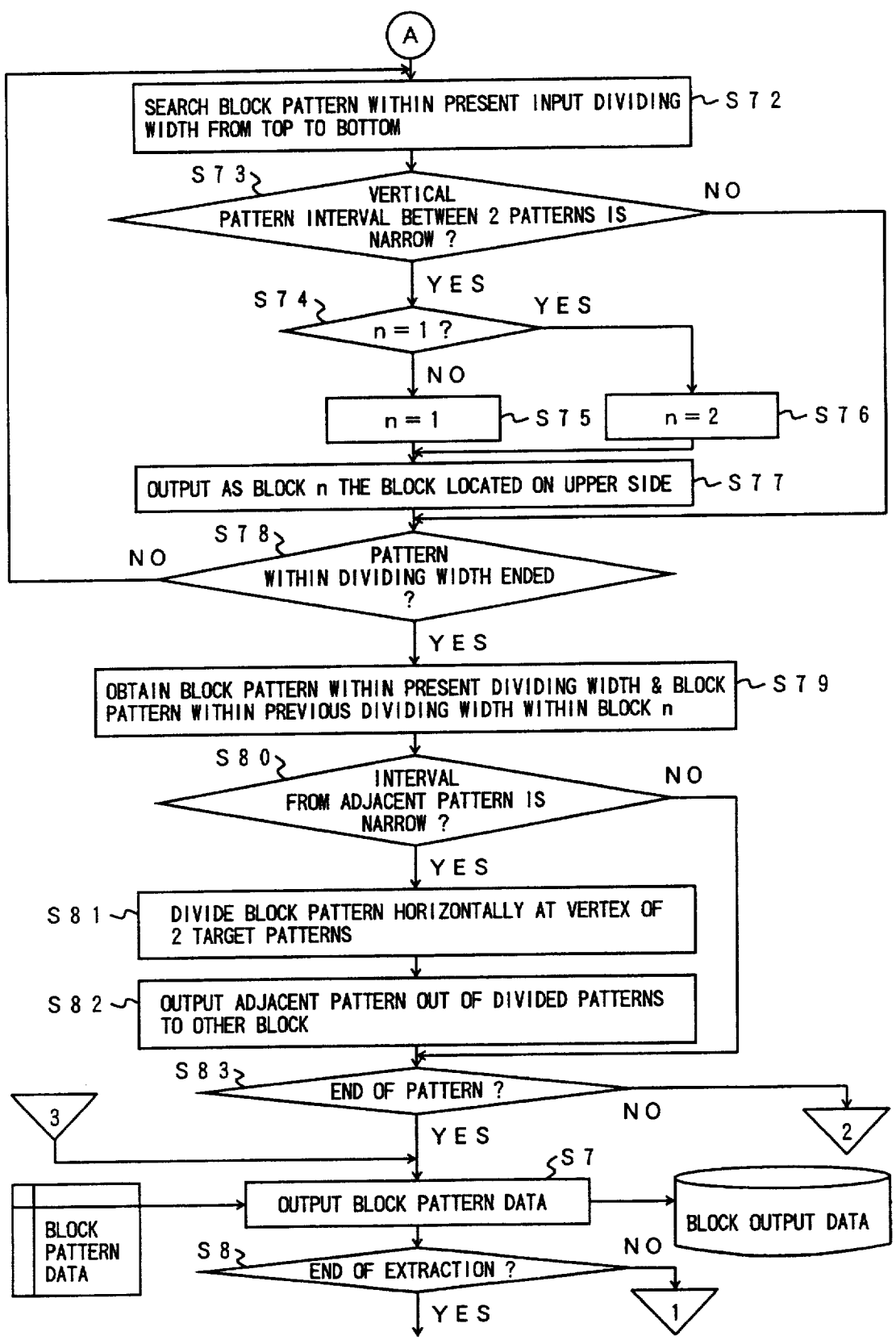

FIGS. 21 and 22 are flow charts showing this embodiment of the method of dividing the block pattern according to the present invention, and show the process of dividing the block pattern and corresponding to the step S6A shown in FIG. 20.

In FIG. 21, if the decision result in the step S5 is YES, the process advances to the step S7 shown in FIG. 22. However, if the decision result in the step S5 is NO, steps S61 through S83 shown in FIGS. 21 and 22 are carried out. These steps S61 through S83 correspond to the step S6A shown in FIG. 20.

A step S61 shown in FIG. 21 inputs the block pattern data related to the block pattern including the prohibiting pattern. This step S61 corresponds to the step S6-1 shown in FIG. 17.

Figure 23:
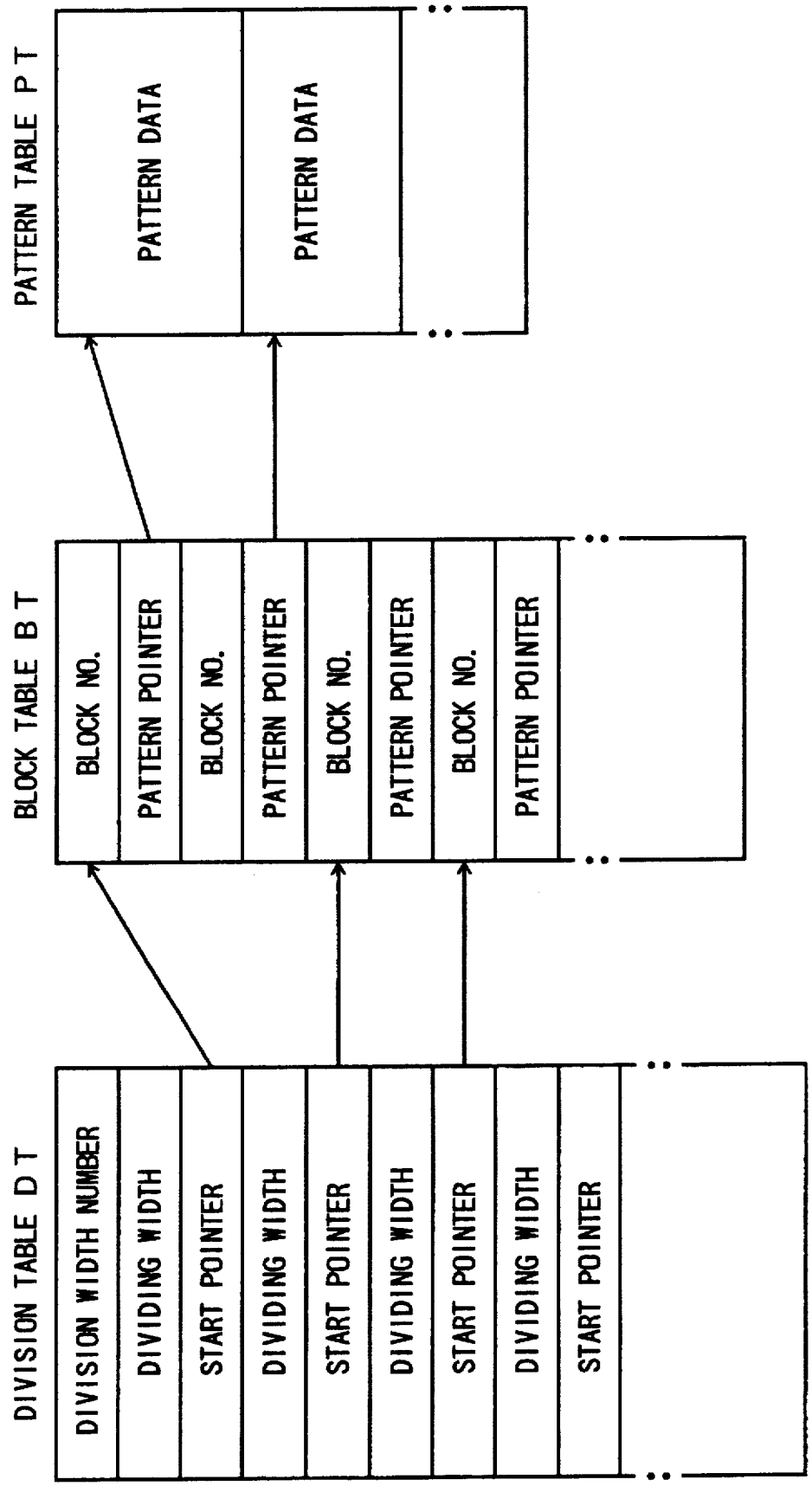
FIG. 23 is a diagram showing a division table, a block table and a pattern table.

A step S62 vertically and simply divides the block pattern which is described by the input block pattern data from each vertex of the block pattern. As a result, the block pattern data related to the vertically and simply divided block patterns is obtained, and a division table DT, a block table BT and a pattern table PT shown in FIG. 23 are made to store the block pattern data. The division table DT includes a number of dividing widths (thereinafter simply referred to as the division width number), the dividing width and the start pointer. This division table DT manages data amounting to each of the dividing widths from the division to the end of the block pattern. The block table BT includes a block number and a pattern pointer, and manages to which one of the 2 blocks the pattern data belongs. In addition, the pattern table PT manages 1 closed pattern data. In this embodiment, it is assumed that information within 1 division width of these tables DT, BT and PT is always obtained by sorting the pattern from the top to bottom. The steps S62 through S83 are carried out while making reference to these tables DT, BT and PT. The step S62 corresponds to the step S6-2 shown in FIG. 17.

A step S63 decides whether or not the dividing width is the odd numbered dividing width. If the decision result in the step S63 is YES, a step S64 sets a block name n to n=1. On the other hand, if the decision result in the step S63 is NO, a step S65 sets the block name n to n=2. In other words, the steps S63 through S65 assign the block name "1" or "2" to the block. The steps S63 through S65 correspond to the step S6-3 shown in FIG. 17.

A step S66 regards as the block n the block pattern amounting to 1 dividing width from the left to the right direction, and outputs the block pattern data related to this block n. This step S66 corresponds to the step S6-4 shown in FIG. 17.

A step S67 decides whether or not the next dividing width is extremely fine (that is, extremely narrow) and the next dividing width exists. If the decision result in the step S67 is NO, the process advances to a step S72 shown in FIG. 22. But if the decision result in the step S67 is YES, a step S68 defines as the block n the block pattern amounting to the next 1 extremely fine dividing width, and outputs this block pattern data. A step S69 decides whether or not the dividing width following (that is, next to) the above next dividing width is large, so as to make a judgement as to whether or not the operation of preventing the generation of extremely fine pattern has ended. If the decision result in the step S69 is NO, a step S70 decides whether or not a sum of the input fine dividing widths is greater than a predetermined value, so as to make a judgement as to whether or not the operation of inputting consecutive fine patterns has ended. If the decision result in the step S70 is NO, the process returns to the step S68. On the other hand, if the decision result in the step S69 or S70 is YES, a step S71 merges (or combines) and compresses all of the data within the input dividing widths. In other words, when the extremely fine dividing widths continue, the step S71 merges and compresses the division table DT, the block table BT and the pattern table PT shown in FIG. 23.

A step S72 shown in FIG. 22 searches (or scans) each of the patterns output in the above steps S67 through S70, one by one, and from the top to bottom, where each of the patterns amount to 1 dividing width from the present start pointer to the next start pointer in the division table DT shown in FIG. 23. A step S73 decides whether or not a vertical pattern interval between 2 patterns is smaller than a predetermined interval. In other words, the step S73 decides whether or not an empty region of the pattern in the vertical direction is extremely fine (or extremely narrow). If the decision result in the step S73 is NO, the process advances to a step S78 which will be described later.

If the decision result in the step S73 is YES, a step S74 decides whether or not n=1, and a step S75 sets n to 1 if the decision result in the step S74 is NO. On the other hand, if the decision result in the step S74 is YES, a step S76 sets n to 2. These steps S74 through S76 determine to which block the output is to be made and carry out the necessary switching of the output. A step S77 outputs the block pattern located on the upper side as the block n, and carries out the operation of distributing the top and bottom patterns to respective target blocks. A step S78 decides whether or not the pattern within the dividing block has ended, and makes a judgement as to whether or not the processes of the steps S72 through S77 have ended. If the decision result in the step S78 is NO, the process returns to the step S72.

If the decision result in the step S78 is YES, a step S79 obtains the block pattern within the dividing width of the present division within the block n and the block pattern within the dividing width of the previous division within the block n. In this case, the method of obtaining the block patterns may obtain the pattern group which is defined as having the block number n within the block table BT shown in FIG. 23 within the dividing widths of the previous and present divisions. A step S80 decides whether or not a pattern interval between the adjacent patterns on the right and left within the block n is narrower than a predetermined interval. If the decision result in the step S80 is NO, the process advances to a step S83 which will be described later.

On the other hand, if the decision result in the step S80 is YES, a step S81 obtains the 2 patterns having the pattern interval which is narrower than the predetermined interval and divides the patterns in the horizontal direction from each vertex of these patterns. In this case, the division of the pattern in the horizontal direction may be carried out similarly to the division of the pattern in the vertical direction as done in the step S62 described above. Since the deformation and separation of the pattern occurs by this division of the pattern in the horizontal direction, it is necessary to update or add the information in the division table DT, the block table BT and the pattern table PT shown in FIG. 23.

A step S82 outputs as the other block the pattern which is closely adjacent (that is, has a narrow interval) out of the patterns divided in the step S81. For example, if the pattern of the block 1 is divided, the adjacent pattern is redefined as the block 2. Similarly, if the pattern of the block 2 is divided, this pattern is redefined as the block 1.

Although not shown in FIG. 22, it is possible to omit the processes of the steps S79 through S82 if the dividing width of the present division is located at the initial left end position. In other words, a decision may be made before the step S79 to decide whether or not the dividing width of the present division is the first dividing width. If the decision result is YES, the process skips to a step S83, but the process advances to the step S79 if the decision result is NO.

The step S83 decides whether or not all of the patterns within the prohibiting pattern have disappeared, and makes a judgement as to whether or not the pattern has ended. If the decision result in the step S83 is NO, the process returns to the step S63 in FIG. 21. On the other hand, if the decision result in the step S83 is YES, the step S7 outputs the block pattern data and stores the block pattern data in the storage unit. In other words, the step S7 outputs the pattern data of the block which includes no prohibiting pattern and the pattern data of the divided block. The step S8 decides whether or not the operation of extracting the block pattern has ended, and makes a judgement as to whether or not the entire process related to the extraction and division of the block pattern has ended. If the decision result in the step S8 is NO, the process returns to the step S4 shown in FIG. 21. On the other hand, the process advances to the step S9 shown in FIG. 20 if the decision result in the step S8 is YES.

As described above, the steps S4, S5 and S61 through S66 shown in FIG. 21 are basically the same as the method of dividing the block pattern in the previous embodiment described above. On the other hand, the steps S67 shown in FIG. 21 et seq. relate to the processes peculiar to this embodiment, and the steps S67 through S71 prevent the generation of the extremely fine pattern. The steps S72 through S78 shown in FIG. 22 relate to the processes carried out to cope with the case where the interval of the upper and lower patterns is narrow. The steps S79 through S82 shown in FIG. 22 relate to the processes carried out to cope with the case where the pattern interval between the block patterns on the right and left after the pattern division is narrow. The step S83 shown in FIG. 22 judges the end with respect to the block pattern. The step S7 outputs the block pattern data, and the step S8 judges the end of the block extraction and division.

In this embodiment, the block pattern including the prohibiting pattern is first divided in the vertical direction in the step S62 and then divided in the horizontal direction in the step S81. However, it is of course possible to divide the block pattern which includes the prohibiting pattern first in the horizontal direction and then in the vertical direction. In other words, the block pattern which includes the prohibiting pattern simply needs to be first divided in a first direction and then be divided in a second direction which is perpendicular to the first direction.

Figure 24A:
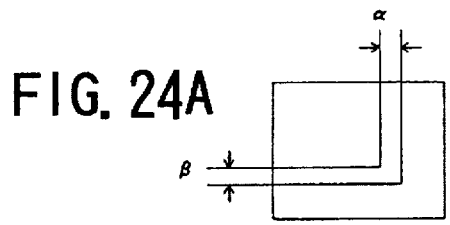
FIGS. 24A, 24B, 24C, 24D, 24E and 24F are diagrams for explaining a procedure for dividing a block including a prohibiting pattern in the embodiment of the method of dividing the block pattern.

Next, a description will be given of the division of a particular block pattern in this embodiment, by referring to FIGS. 24 through 30. FIG. 24A shows a block pattern which is divided because it includes a prohibiting pattern, and FIGS. 24B through 24F show how the block pattern shown in FIG. 24A is divided in this embodiment. In addition, FIGS. 25 through 30 respectively show states of the division table DT, the block table BT and the pattern table PT at various stages of the division of the block pattern shown in FIG. 24A. In other words, FIGS. 25 through 30 are diagrams showing the procedure for storing the information to these tables DT, BT and PT.

Figure 24B:
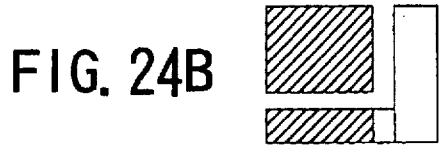
Figure 24B:
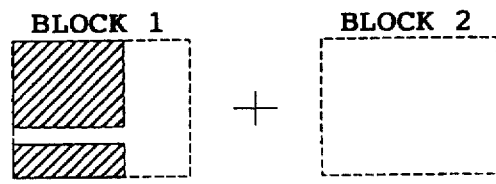
Figure 25:
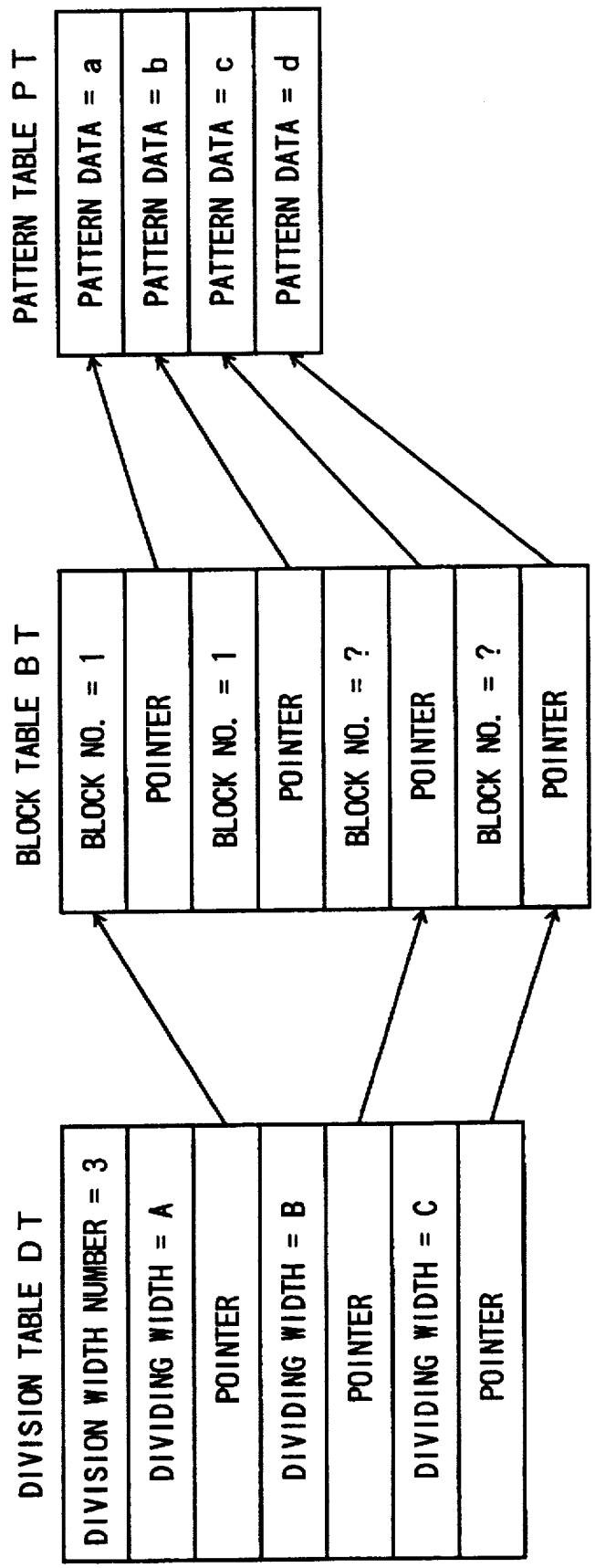
FIGS. 25, 26, 27, 28, 29 and 30 respectively are diagrams showing the division table, the block table and the pattern table in various stages of the block pattern division for explaining the procedure of storing information into these tables.

In FIG. 24A, the block pattern which includes the prohibiting pattern includes extremely fine pattern intervals α and β. These intervals α and β are defined as predetermined intervals the generation of which should be prohibited because problems will occur from the point of view of the exposure. When the block pattern shown on the left side in FIG. 24B is divided in the vertical direction at the dividing width A in the step S62 shown in FIG. 21, the block 1 shown on the right side in FIG. 24B is first obtained, and the information shown in FIG. 25 are stored in the division table Dt, the block table BT and the pattern table PT shown in FIG. 23. 1 data in the division table DT shown in FIG. 25 corresponds to the dividing width to be processed. Next, the patterns (a and b) are output to the block 1 by the steps S63 through S66 shown in FIG. 21, and the state shown on the right side of FIG. 24B is obtained.

Figure 24C:
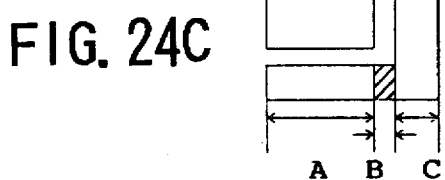
Figure 24C:
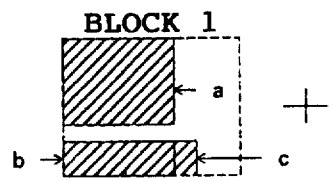
Figure 26:
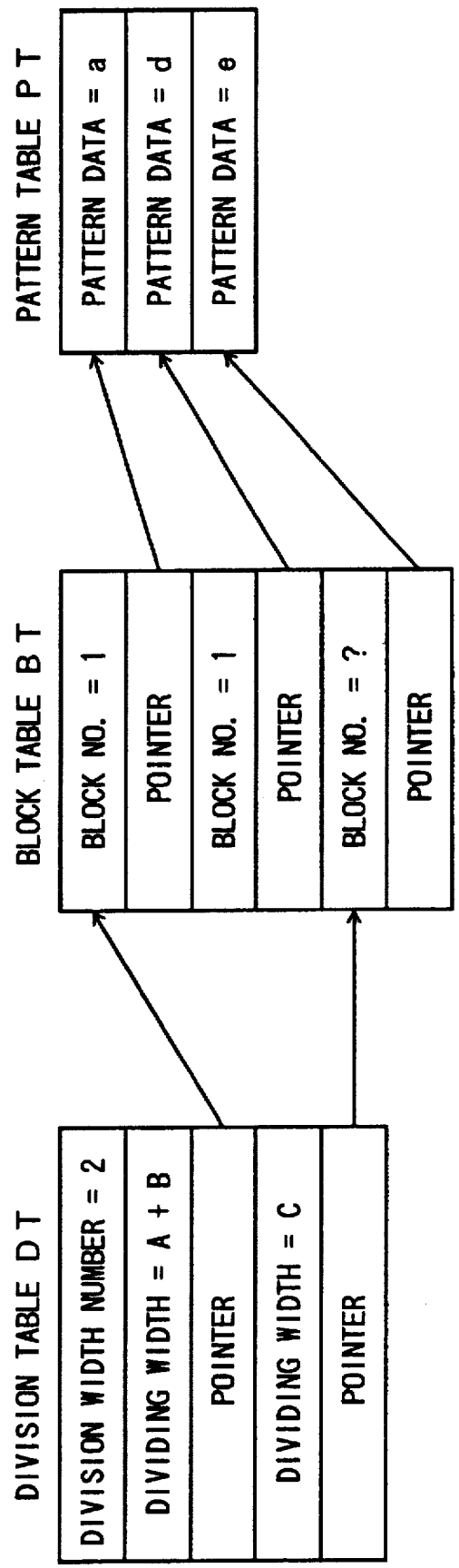

Next, when the next dividing width B is input from the division table DT shown in FIG. 25 as shown on the left side of FIG. 24C, the decision result in the step S67 shown in FIG. 21 becomes YES, and the step S68 shown in FIG. 21 enters the next pattern c into the block 1. Since the dividing width C next to the next to the dividing width B is wide, the decision result in the step S69 shown in FIG. 21 becomes YES, and the process advances to the step S71. The step S71 carries out the process of merging the pattern data within the dividing width B which is the target of the present process within the same block. At this point in time, the state of each block becomes as shown on the right side of FIG. 24C. In addition, the states of the tables DT, BT and PT after the merger become as shown in FIG. 26. By this merger, the dividing widths A and B of the division table DT are merged, and the patterns b and c shown in FIG. 24C and the related parts of the block table BT are also merged.

Figure 24D:
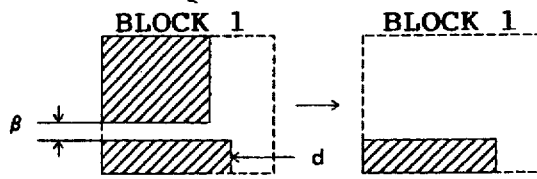
Figure 24D:
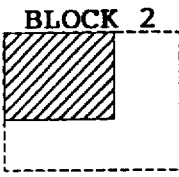
Figure 27:
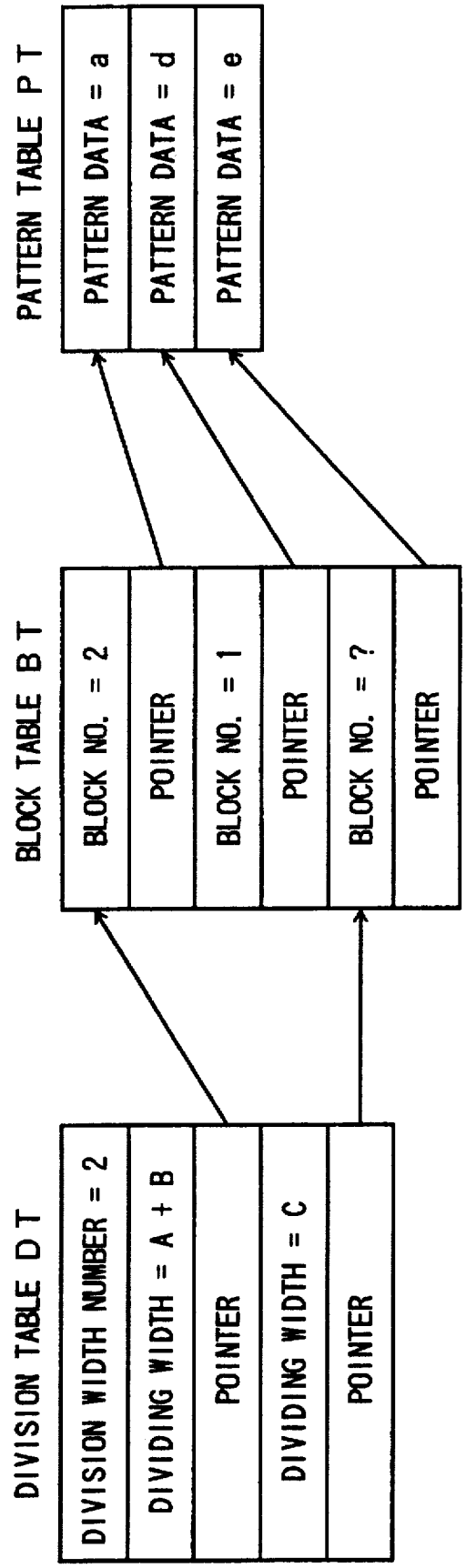

As shown on the left side of FIG. 24D, the 2 patterns a and d within the block 1 which is obtained by the present division are input from the block table BT and the pattern table PT shown in FIG. 26, and the steps S72 and S73 shown in FIG. 22 are carried out to search (or scan) from the top to bottom and to decide whether or not the interval between the 2 patterns a and d on the upper and lower sides is narrower than the predetermined interval. In this case, the interval β is an extremely fine interval, and for this reason, the upper pattern a out of the 2 patterns a and d is output to the block 2 by the steps S74 through S77 shown in FIG. 22 as shown on the right side of FIG. 24D. Hence, the patterns of the blocks 1 and 2 become as shown on the right side of FIG. 24D, and as a result, the contents of the tables DT, BT and PT become as shown in FIG. 27.

In the process shown in FIG. 22, the process thereafter advances to the step S79. But in this case, the dividing width is the first dividing width. Accordingly, as described above, the steps S79 through S82 are not carried out, and the process returns to the step S63 shown in FIG. 21 because the decision result in the step S83 shown in FIG. 22 is NO in this case.

The next dividing width is the dividing width C as shown on the left side of FIG. 24C. Hence, the pattern e is output to the block 2 as shown on the right side of FIG. 24E by the steps S63 through S66 shown in FIG. 21. After this output of the pattern e to the block 2, the tables DT, BT and PT assume the states shown in FIG. 28. Since the present dividing width C is the last dividing width, the decision result in the step S67 shown in FIG. 21 becomes NO, and the process advances to the step S72 shown in FIG. 22.

Figure 24E:
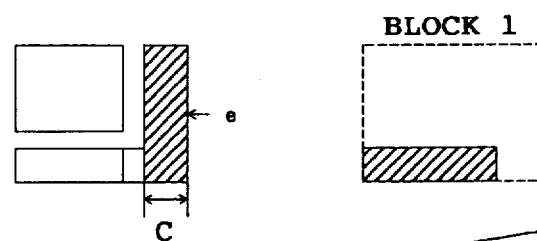
Figure 24E:
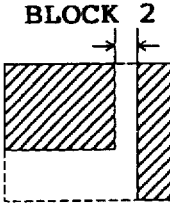

Only 1 pattern e exists within this dividing width C as shown on the left side of FIG. 24E. Hence, the decision result in the step S73 shown in FIG. 22 becomes NO, and the process advances to the step S78.

Figure 24F:
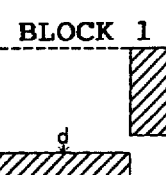
Figure 24F:
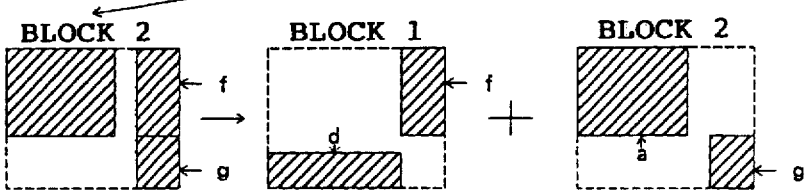
Figure 24F:
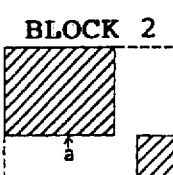
Figure 28:
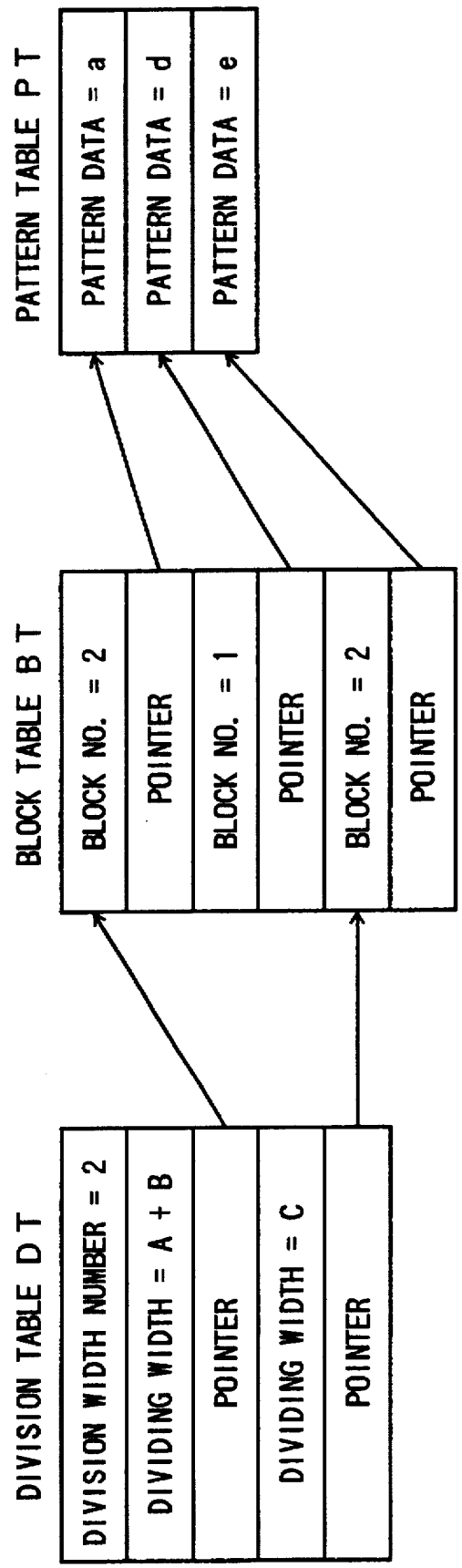
Figure 29:
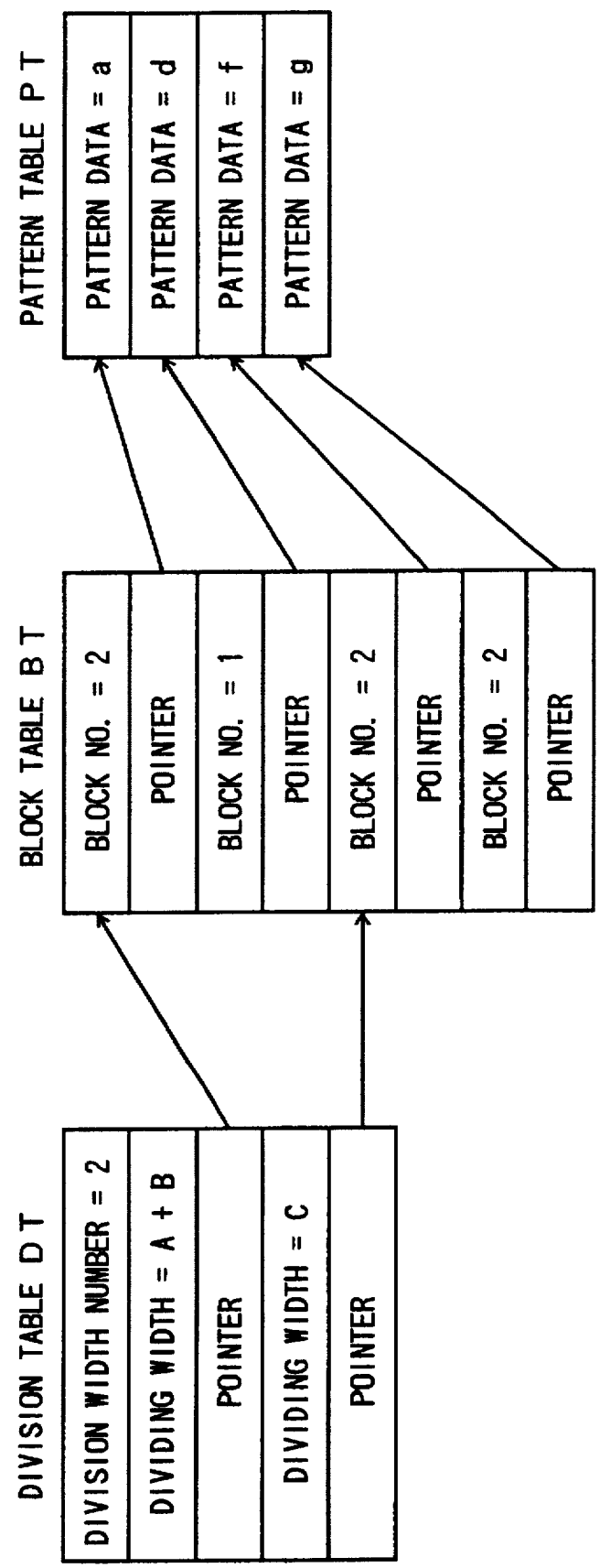
Figure 30:
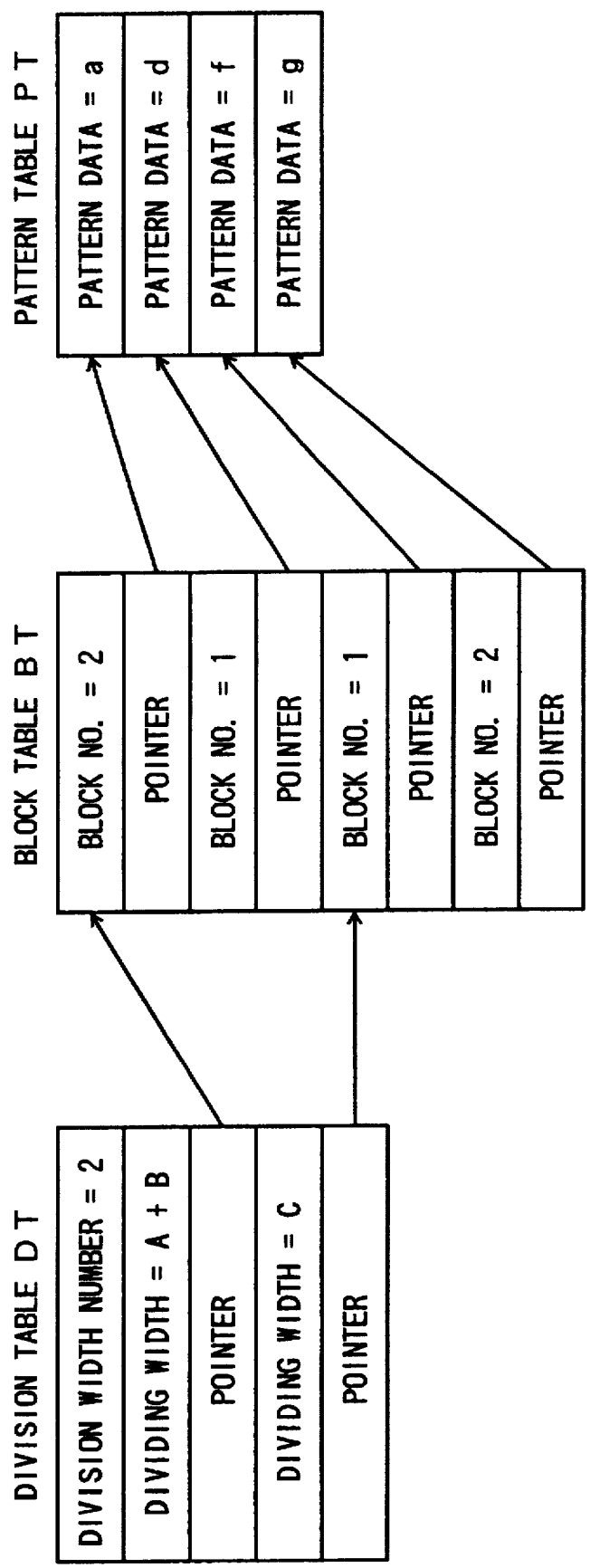

This step S78 obtains the patterns a and e shown on the right side of FIG. 24E that are defined as the block 2 belonging to the dividing width C and the previous dividing widths A+B, based on the block table BT and the pattern table PT shown in FIG. 28. In this case, the decision result in the step S80 becomes YES because the interval a is an extremely fine interval, and the process advances to the step S81. The step S81 divides the patterns a and e in the horizontal direction from each vertex of the patterns a and e, so that patterns f and g shown on the left side of FIG. 24F are obtained. Since the patterns a and e are deformed and separated by this division in the horizontal direction, the contents of the block table BT and the pattern table PT are updated and added as shown in FIG. 29.

Next, the step S82 can recognize from the information at the time of the division in the horizontal direction that the adjacent pattern f is the upper pattern. And because the block number of this pattern f is defined as being 2 in the block table BT shown in FIG. 29, the block number is redefined to 1. Thereafter, the step S83 shown in FIG. 22 makes the judgement as to whether or not the pattern has ended, and the process advances to the step S7 because the decision result in this case become YES. In this state, the blocks finally obtained become as shown on the right side of FIG. 24F, and the tables DT, BT and PT assume the states shown in FIG. 30. In other words, as shown on the right side of FIG. 24F, the block 1 includes the patterns d and f, while the block 2 includes the patterns a and g.

Accordingly, it becomes possible to divide the block shown in FIG. 24A including the prohibiting pattern, and obtain the 2 blocks 1 and 2 shown on the right side of FIG. 24F and including no prohibiting pattern.

FIGS. 31 through 38 are diagrams for comparing the division of various blocks by the previously described embodiment and this embodiment described immediately above.

Figure 31:
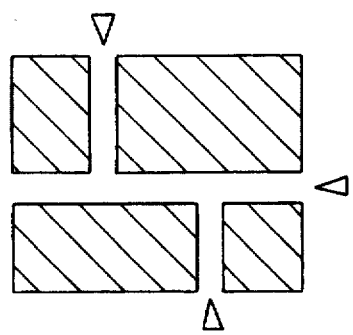
FIG. 31 is a diagram showing a block pattern including a prohibiting pattern.

FIG. 31 shows a block pattern including a prohibiting pattern. In FIG. 31, a triangular mark indicates a portion with an extremely fine pattern interval that cause problems from the point of view of the exposure.

Figure 32A:
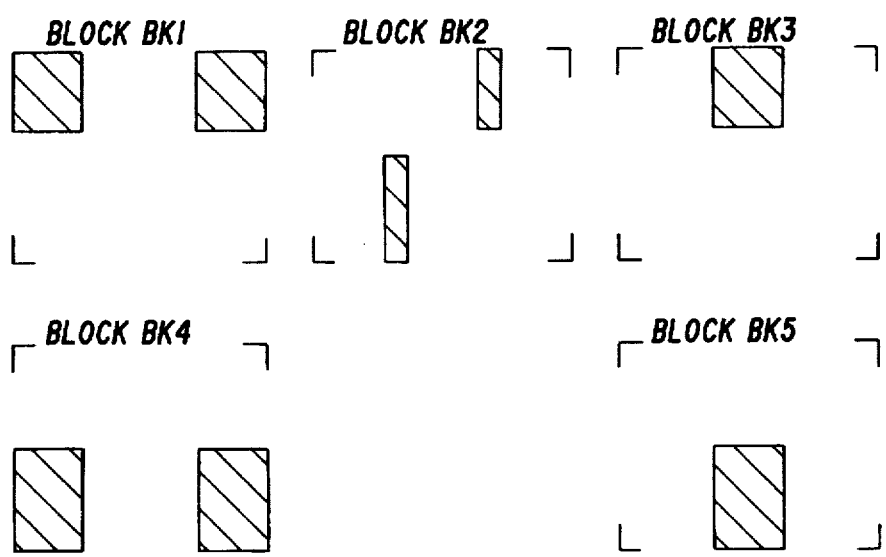
FIGS. 32A and 32B are diagrams for comparing divisions of the block shown in FIG. 31 by the two embodiments.
Figure 32B:
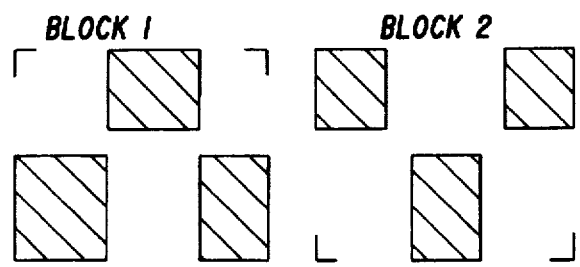

FIG. 32A shows blocks BK1 through BK5 which are obtained by dividing the block pattern shown in FIG. 31 by the previously described embodiment. On the other hand, FIG. 32B shows blocks 1 and 2 which are obtained by dividing the block pattern shown in FIG. 31 by this embodiment. As may be seen by comparing FIGS. 32A and 32B, the previously described embodiment requires repeated divisions of the block pattern, and the number of block patterns finally obtained is 5 which is relatively large and the original significance of the block exposure may be lost thereby. But according to this embodiment, the number of block patterns finally obtained is only 2, and the significance of the block exposure will not be lost by the division of the block pattern made to eliminate the prohibiting pattern.

Figure 33:
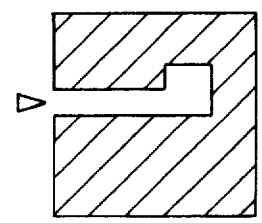
FIG. 33 is a diagram showing a block pattern including a prohibiting pattern.

FIG. 33 shows a block pattern including a prohibiting pattern. In FIG. 33, a triangular mark indicates a portion with an extremely fine pattern interval that cause problems from the point of view of the exposure.

Figure 34A:
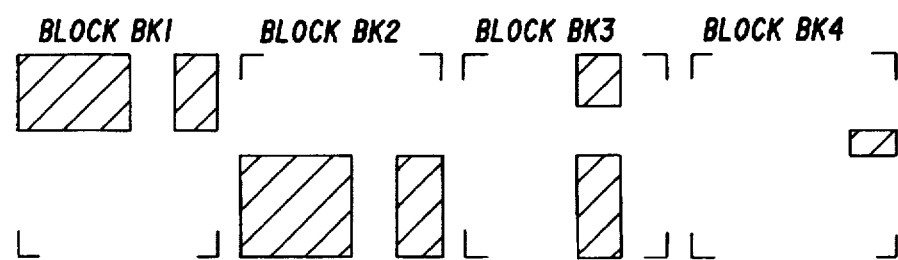
FIGS. 34A and 34B are diagrams for comparing the divisions of the block shown in FIG. 33 by the two embodiments.
Figure 34B:
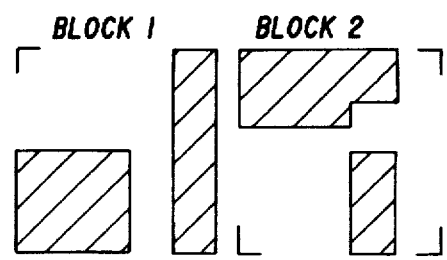

FIG. 34A shows blocks BK1 through BK4 which are obtained by dividing the block pattern shown in FIG. 33 by the previously described embodiment. On the other hand, FIG. 34B shows blocks 1 and 2 which are obtained by dividing the block pattern shown in FIG. 33 by this embodiment. As may be seen by comparing FIGS. 34A and 34B, the previously described embodiment requires repeated divisions of the block pattern, and the number of block patterns finally obtained is 4 which is relatively large and the original significance of the block exposure may be lost thereby. But according to this embodiment, the number of block patterns finally obtained is only 2, and the significance of the block exposure will not be lost by the division of the block pattern made to eliminate the prohibiting pattern.

FIG. 35 shows a block pattern including a prohibiting pattern. In FIG. 35, a triangular mark indicates a portion with an extremely fine pattern interval that cause problems from the point of view of the exposure.

FIG. 36A shows blocks BK1 through BK4 which are obtained by dividing the block pattern shown in FIG. 35 by the previously described embodiment. On the other hand, FIG. 36B shows blocks 1 and 2 which are obtained by dividing the block pattern shown in FIG. 35 by this embodiment. As may be seen by comparing FIGS. 36A and 36B, the previously described embodiment requires repeated divisions of the block pattern, and the number of block patterns finally obtained is 4 which is relatively large and the original significance of the block exposure may be lost thereby. But according to this embodiment, the number of block patterns finally obtained is only 2, and the significance of the block exposure will not be lost by the division of the block pattern made to eliminate the prohibiting pattern.

FIG. 37 shows a block pattern including a prohibiting pattern. In FIG. 37, a triangular mark indicates a portion with an extremely fine pattern interval that cause problems from the point of view of the exposure.

FIG. 38A shows blocks BK1 through BK3 which are obtained by dividing the block pattern shown in FIG. 37 by the previously described embodiment. On the other hand, FIG. 38B shows blocks 1 and 2 which are obtained by dividing the block pattern shown in FIG. 37 by this embodiment. As may be seen by comparing FIGS. 38A and 38B, the previously described embodiment requires repeated divisions of the block pattern, and the number of block patterns finally obtained is 3 which is relatively large and the original significance of the block exposure may be lost thereby. But according to this embodiment, the number of block patterns finally obtained is only 2, and the significance of the block exposure will not be lost by the division of the block pattern made to eliminate the prohibiting pattern.

Of course, it may be readily understood that the embodiments described above may be appropriately combined to realize an improved pattern judging method and a mask producing method.

Further, the present invention is not limited to these embodiments, but various variations and modifications may be made without departing from the scope of the present invention.

What is claimed is:

1. A method of dividing a block pattern for use in a block exposure, to be implemented on a computer, dividing an arbitrary block which is to be formed in a block mask that is used for the block exposure when the arbitrary block is judged as including a prohibiting pattern which is undesirable from a point of view of the block exposure, said method comprising the steps of:

(a) automatically judging whether or not said arbitrary block includes the prohibiting pattern, said step (a) comprising the sub steps of:

(a1) dividing an area of the block mask where a desired pattern is to be formed into a plurality of regions;

(a2) calculating a predetermined physical quantity, based on a charged particle beam being irradiated in a predetermined pattern formed in each of the regions where one or a plurality of openings corresponding to the predetermined pattern are formed in the block mask; and (a3) judging that the desired pattern includes a prohibiting pattern if the predetermined quantity calculated in said sub (a2) exceeds a threshold value;

(b) dividing said arbitrary block in a first direction to obtain a first block having a first dividing width along a second direction which is perpendicular to the first direction;

(c) dividing a remaining block portion of said arbitrary block excluding said first block in the first direction to obtain a first divided portion having a second dividing width along the second direction, and merging said first dividing portion to said first block if the second dividing width is less than a predetermined width;

(d) searching said first block in the first direction after said step (c) and merging one of two adjacent first patterns within said first block to a second block if a pattern interval which is less than a determined value extends along the first direction between said first patterns.

2. The method of dividing the block pattern as claimed in claim 1, which further comprises the step of:

(e) dividing, after said step (c), a remaining block portion of said arbitrary block excluding said first block in the first direction to obtain a second divided portion having a third dividing width along the second direction, and merging said second divided portion to said second block.

3. The method of dividing the block pattern as claimed in claim 2, which further comprises the step of:

(f) dividing said second divided portion within said second block in the second direction if a prohibiting pattern is included in said second block so as to obtain two second patterns, and merging one of said second patterns to said first block.

4. The method of dividing the block pattern as claimed in claim 3, wherein:

pattern data related to said arbitrary block are managed using a division table, a block table and a pattern table when said arbitrary block is divided by said steps (a) through (f), said division table at least managing a number of dividing widths, each dividing width and a start pointer corresponding to each dividing width, said block table at least managing a block number for identifying each of said first and second blocks and a pattern pointer corresponding to each block number, said pattern table managing at least the pattern data.

5. The method of dividing the block pattern as claimed in claim 1, wherein said arbitrary block is divided into only two blocks which are formed by said first and second blocks.

6. The method of dividing the block pattern as claimed in claim 1, wherein said first direction is one of a vertical direction and a horizontal direction.

7. The method of dividing the block pattern as claimed in claim 1, wherein said step (a1) divides the area of the block mask into the regions by forming a bit map which described each of the regions by one bit.

8. The method of dividing the block pattern as claimed in claim 1, wherein the predetermined physical quantity is selected from a group consisting of a temperature rise at each region caused by a charged particle beam irradiated thereon, a load acting at each region, and a stress generated at each region.

9. The method of dividing the block pattern as claimed in claim 1, wherein the predetermined physical quantity is an arbitrary combination of quantities selected from a group consisting of a temperature rise at each region caused by a charged particle beam irradiated thereon, a load acting at each region, and a stress generated at each region.

10. The method of dividing the block pattern as claimed in claim 1, wherein said step (a) further comprises the sub step of:

(a4) dividing the desired pattern into a plurality of kinds of mutually independent patterns if the predetermined quantity calculated in the sub step (a2) exceeds the threshold value for at least one of the regions, and said sub steps (a1), (a2) and (a3) are repeated by taking each of the mutually independent patterns as the desired pattern.

11. The method of dividing the block pattern as claimed in claim 10, wherein said sub step (a4) divides the desired pattern into one or a plurality of rectangular patterns and one pattern having an arbitrary shape.

12. The method of dividing the block pattern as claimed in claim 10, wherein said sub step (a4) divides the desired pattern into one or a plurality of patterns which generally extend in a third direction and one or a plurality of patterns which generally extend in a fourth direction which is perpendicular to the third direction.

13. A block mask producing method for producing a block mask which is used for drawing patterns on an object by a charged particle beam transmitted through the patterns of the block mask, said block mask producing method comprising the steps of:

(a) extracting a pattern data related to a desired pattern which is to be formed in the block mask;

(b) dividing an area of the block mask where the desired pattern is to be formed into a plurality of regions;

(c) calculating a predetermined physical quantity, based on said charged particle beam being irradiated in a predetermined pattern formed in each of the regions where one or a plurality of openings corresponding to the predetermined pattern are formed in the block mask;

(d) determining whether or not the predetermined quantity calculated in said step (c) exceeds a threshold value for all of the regions;

(e) forming the one or plurality of openings corresponding to the predetermined pattern in corresponding region of the block mask if said step (d) determines that the predetermined quantity does not exceed the threshold value for each of the regions; and (f) eliminating an arbitrary block including a prohibiting pattern and having the predetermined quantity which is calculated as exceeding the threshold value in said step (d), said prohibiting pattern being undesirable on the block mask from a point of view of block exposure, said step (f) comprising the sub steps of:

(f1) dividing said arbitrary block in a first direction to obtain a first block having a first dividing width along a second direction which is perpendicular to the first direction;

(f2) dividing a remaining block portion of said arbitrary block excluding said first block in the first direction to obtain a first divided portion having a second dividing width along the second direction, and merging said first dividing portion to said first block if the second dividing width is less than a predetermined width; and (f3) searching said first block in the first direction after said sub step (f2) and merging one of two adjacent first patterns within said first block to a second block if a pattern interval which is less than a predetermined value extends along the first direction between said first patterns.

14. The block mask producing method as claimed in claim 13, wherein said step (f) further comprises the sub step of:

(f4) dividing, after said sub step (f2), a remaining block portion of said arbitrary block excluding said first block in the first direction to obtain a second divided portion having a third dividing width along the second direction, and merging said second divided portion to said second block.

15. The block mask producing method as claimed in claim 14 wherein said step (f) further comprises the sub step of:

(f5) dividing said second divided portion within said second block in the second direction if a prohibiting pattern is included in said second block so as to obtain two second patterns, and merging one of said second patterns to said first block.

16. The block mask producing method as claimed in claim 15, wherein:

pattern data related to said arbitrary block are managed using a division table, a block table and a pattern table when said arbitrary block is divided by said sub steps (f1) through (f5), said division table at least managing a number of dividing widths, each dividing width and a start pointer corresponding to each dividing width, said block table at least managing a block number for identifying each of said first and second blocks and a pattern pointer corresponding to each block number, said pattern table managing at least the pattern data.

17. The block mask producing method as claimed in claim 13, wherein said arbitrary block is divided into only two blocks which are formed by said first and second blocks.

18. The block mask producing method as claimed in claim 14, wherein said first direction is one of a vertical direction and a horizontal direction.

\* \* \* \* \*